US008372305B2

(12) United States Patent
Schubert et al.

(10) Patent No.: US 8,372,305 B2
(45) Date of Patent: Feb. 12, 2013

(54) CHEMICAL-MECHANICAL POLISHING COMPOSITION COMPRISING METAL-ORGANIC FRAMEWORK MATERIALS

(75) Inventors: Markus Schubert, Ludwigshafen (DE); Sven Thate, Wellington Heights (TW)

(73) Assignee: BASF SE, Ludwigshafen (DE)

( * ) Notice: Subject to any disclaimer, the term of this patent is extended or adjusted under 35 U.S.C. 154(b) by 442 days.

(21) Appl. No.: 12/600,539

(22) PCT Filed: May 21, 2008

(86) PCT No.: PCT/EP2008/056230
§ 371 (c)(1),
(2), (4) Date: Nov. 17, 2009

(87) PCT Pub. No.: WO2008/142093
PCT Pub. Date: Nov. 27, 2008

(65) Prior Publication Data
US 2010/0178767 A1 Jul. 15, 2010

(30) Foreign Application Priority Data
May 24, 2007 (EP) .................................... 07108798

(51) Int. Cl.
*C09K 13/00* (2006.01)
(52) U.S. Cl. ...... 252/79.1; 252/79.2; 438/692; 438/693; 216/89
(58) Field of Classification Search .................. 438/692, 438/693, 690, 691; 252/79.1, 2, 79.2, 79.3; 216/89.9, 89, 90, 103
See application file for complete search history.

(56) References Cited

U.S. PATENT DOCUMENTS

| 5,648,508 | A | 7/1997 | Yaghi |
| 5,916,819 | A | 6/1999 | Skrovan et al. |
| 6,136,218 | A | 10/2000 | Skrovan et al. |
| 6,136,711 | A * | 10/2000 | Grumbine et al. ............ 438/692 |
| 6,280,924 | B1 | 8/2001 | Skrovan et al. |
| 7,556,673 | B2 | 7/2009 | Schubert et al. |
| 2003/0222023 | A1 | 12/2003 | Mueller et al. |
| 2006/0030158 | A1* | 2/2006 | Carter et al. ................. 438/692 |
| 2006/0138087 | A1* | 6/2006 | Simka et al. .................... 216/88 |
| 2006/0163206 | A1* | 7/2006 | Belov et al. ..................... 216/88 |
| 2006/0207635 | A1* | 9/2006 | Bian .............................. 134/42 |
| 2006/0270235 | A1* | 11/2006 | Siddiqui et al. ............... 438/692 |
| 2008/0188677 | A1 | 8/2008 | Schubert et al. |
| 2008/0214719 | A1 | 9/2008 | Khvorost et al. |
| 2008/0227634 | A1 | 9/2008 | Muller et al. |
| 2008/0248944 | A1 | 10/2008 | Thate et al. |
| 2008/0281116 | A1 | 11/2008 | Schubert et al. |
| 2008/0300387 | A1 | 12/2008 | Schubert et al. |
| 2009/0023882 | A1 | 1/2009 | Hanefeld et al. |
| 2009/0032023 | A1 | 2/2009 | Pastre et al. |
| 2009/0042000 | A1 | 2/2009 | Schubert et al. |
| 2009/0133576 | A1 | 5/2009 | Schubert et al. |
| 2009/0165933 | A1 | 7/2009 | Loesch et al. |
| 2009/0171107 | A1 | 7/2009 | Puetter et al. |
| 2009/0183996 | A1 | 7/2009 | Richter et al. |
| 2009/0198079 | A1 | 8/2009 | Schubert et al. |

FOREIGN PATENT DOCUMENTS

| DE | 100 36 031 | 2/2002 |
| DE | 101 11 230 | 9/2002 |
| DE | 103 55 087 | 6/2005 |
| EP | 0 790 253 | 8/1997 |
| EP | 1 522 565 | 4/2005 |
| WO | 03 102000 | 12/2003 |
| WO | 2004 076574 | 9/2004 |
| WO | 2005 049892 | 6/2005 |
| WO | 2005 100496 | 10/2005 |
| WO | 2006 092376 | 9/2006 |
| WO | 2007 023134 | 3/2007 |
| WO | 2007 131955 | 11/2007 |

OTHER PUBLICATIONS

U.S. Appl. No. 12/863,339, filed Jul. 16, 2010, Schubert et al.
S. Ramakrishnan, et al., "Comparison of Dicarboxylic Acids as Complexing Agents for Abrasive-Free Chemical Mechanical Planarization of Copper", Science Direct, Microelectronic Engineering, 2007, 80-86.
U.S. Appl. No. 13/003,839, filed Jan. 12, 2011, Schubert et al.
U.S. Appl. No. 12/063,202, filed Feb. 7, 2008, Thate, et al.
U.S. Appl. No. 12/063,522, filed Feb. 11, 2008, Schubert, et al.
U.S. Appl. No. 12/161,024, filed Jul. 16, 2008, Schubert, et al.
U.S. Appl. No. 12/294,789, filed Sep. 26, 2008, Schubert, et al.
U.S. Appl. No. 12/594,748, filed Sep. 26, 2008, Schubert, et al.
U.S. Appl. No. 12/297,298, filed Oct. 15, 2008, Schubert, et al.
U.S. Appl. No. 12/297,294, filed Dec. 18, 2008, Schubert, et al.
U.S. Appl. No. 12/375,218, filed Jan. 27, 2009, Schubert, et al.
U.S. Appl. No. 12/444,464, filed Apr. 6, 2009, Braeuninger, et al.
U.S. Appl. No. 12/447,671, filed Apr. 29, 2009, Schubert, et al. U.S. Appl. No. 12/445,322, filed Apr. 13, 2009, Trukhan, et al.
U.S. Appl. No. 12/521,337, filed Jun. 26, 2009, Schubert, et al.
U.S. Appl. No. 12/594,347, filed Oct. 2, 2009, Stein, et al.
U.S. Appl. No. 12/594,604, filed Oct. 5, 2009, Stein, et al.

* cited by examiner

*Primary Examiner* — Lan Vinh
(74) *Attorney, Agent, or Firm* — Oblon, Spivak, McClelland, Maier & Neustadt, L.L.P.

(57) ABSTRACT

The present invention relates to compositions for chemical-mechanical polishing comprising A 0.01% to 40% by weight based on the total amount of the composition of abrasive particles of at least one porous metal-organic framework material, wherein the framework material comprises at least one at least bidentate organic compound which is coordinately bound to at least one metal ion; B 40% to 99.8% by weight based on the total amount of the composition of a liquid carrier; and C 0.01% to 20% by weight based on the total amount of the composition of a polishing additive component. The invention further relates to the use of said composition as well as methods for chemical-mechanical polishing of a surface with the aid of said compositions.

15 Claims, No Drawings

CHEMICAL-MECHANICAL POLISHING COMPOSITION COMPRISING METAL-ORGANIC FRAMEWORK MATERIALS

The present invention relates to a composition for chemical-mechanical polishing, the use thereof as well as methods for chemical-mechanical polishing.

Compositions for the chemical-mechanical polishing are known in the art and comprise typically at least a solid component as well as a liquid carrier. These compositions are often called slurries.

These polishing slurries are often used with polishing pads, which are saturated with a slurry composition. Typical abrasive materials are silicon dioxide, metal oxides, like aluminium oxide, cerium oxide, organic polymer particles and the like.

They are often used to polish semiconductor wafers or integrated circuit chips, wherein the manufacturing process includes the formation of metal surfaces by deposition followed by a chemical-mechanical polishing step.

WO-A 2004/076574 describes a chemical-mechanical polishing system comprising an abrasive (the solid component), a liquid carrier and a sulfonic acid compound.

WO-A 2005/100496 describes a chemical-mechanical polishing composition comprising an abrasive comprising α-alumina, a liquid carrier and metal ions of the alkaline earth metals.

EP-A 1522565 describes an aqueous slurry composition comprising abrasive particles, oxidizers, an acid as well as quaternary ammonium hydroxides.

S. Ramakrishnan et al., Microelectronic Engineering 84 (2007), 80-86, describe a chemical-mechanical polishing system, which is abrasive-free by using complexing agents like dicarboxylic acids.

Even though there are chemical-mechanical polishing systems known in the art, there is a need for new systems having advanced properties with regard to the polishing process.

Thus, an object of the present invention is to provide such systems and processes.

Accordingly, the present invention provides a composition for chemical-mechanical polishing comprising
A 0.01% to 40% by weight based on the total amount of the composition of abrasive particles of at least one porous metal-organic framework material, wherein the framework material comprises at least one at least bidentate organic compound which is coordinately bound to at least one metal ion;
B 40% to 99.8% by weight based on the total amount of the composition of a liquid carrier; and
C 0.01% to 20% by weight based on the total amount of the composition of a polishing additive component.

It was found that a typical chemical-mechanical polishing composition having abrasive particles of one or more porous metal-organic framework materials (MOFs) have good abrasive properties and especially for the polishing of metal surfaces the removal products (e.g. metal ions) of the surface material may be adsorbed by the porous metal-organic framework material. In addition additives can be adsorbed into the porous structure, which are set free under pressure/shear force on the surface to be polished. The advantageous properties may be caused by the fact that metal-organic framework materials are built from materials, which strongly interact with metals and metal ions By choosing the appropriate composition of the MOF specific interactions (attraction, repulsion) can be generated to improve selectivity, i.e. the removal of certain areas of the wafer (e.g. Cu) and the protection of others (e.g. Ta). Furthermore, the use of metal-organic framework materials results in less scratches on the surface due to the flexible structure of the MOF. Furthermore the material has a low density resulting in good stability of the slurry. The fact that MOF can be dissolved in either acidic or basic conditions can be used to facilitate post CMP cleaning.

As component A for the composition for the chemical-mechanical polishing according to the present invention 0.01% to 40% by weight based on the total amount of the composition abrasive particles are used of at least one porous metal-organic framework material, wherein the framework material comprises at least one at least bidentate organic compound which is coordinately bound to at least one metal ion.

Component A may consist of one or more different porous metal-organic framework materials.

Furthermore, it is possible that the composition according to the present invention also comprises additional abrasive particles of other solids, like silicon dioxide, metal oxides or the like. Preferably, only metal-organic framework material particles are used.

Preferably, the component A is comprised in the composition according to the present invention in the range of 0.1% to 30% by weight, more preferred 0.2% to 15% by weight and even more preferred 0.3 to 10% by weight.

The porous metal-organic framework material to be used is known in the prior art.

The porous metal-organic framework material comprises at least one at least bidentate, organic compound, which is bound by coordination to a metal ion. This metal-organic framework material (MOF) is described, for example, in U.S. Pat. No. 5,648,508, EP-A-0 790 253, M. O'Keeffe et al., J. Sol. State Chem., 152 (2000), pages 3 to 20, H. Li et al., Nature 402 (1999), page 276, M. Eddaoudi et al., Topics in Catalysis 9 (1999), pages 105 to 111, B. Chen et al., Science 291 (2001), pages 1021 to 1023 and DE-A-101 11 230 as well as A. C. Sudik, et al., J. Am. Chem. Soc. 127 (2005), 7110-7118.

The metal-organic framework materials according to the present invention comprise pores, in particular micropores and/or mesopores. Micropores are defined as those having a diameter of 2 nm or less and mesopores are defined by a diameter in the range from 2 to 50 nm, in each case in accordance with the definition as reported in Pure & Applied Chem. 57 (1985), 603-619, in particular page 606. The presence of micropores and/or mesopores can be checked with the aid of sorption measurements, these measurements determining the uptake capacity of the metal-organic framework material for nitrogen at 77 Kelvin as specified in DIN 66131 and/or DIN 66134.

Preferably, the specific surface area, calculated according to the Langmuir model (DIN 66131, 66134) for an MOF in powder form is greater than 5 $m^2/g$, more preferably above 10 $m^2/g$, more preferably greater than 50 $m^2/g$, further more preferably greater than 500 $m^2/g$, further more preferably greater than 1000 $m^2/g$, and particularly preferably greater than 1500 $m^2/g$.

The pore volume ($H_2O$ uptake) is typically in the range of 0.05 to 2.5 ml/g, more particularly 0.1 to 1.5 ml/g and even more particular 0.1 to 1 ml/g.

The pore diameter (calculated) is typically in the range of 2 to 30 Å, more particularly 3 to 15 Å.

The metal component in the framework material according to the present invention is preferably selected from the groups Ia, IIa, IIIa, IVa to VIIIa and Ib to VIb. Particular preference is given to Mg, Ca, Sr, Ba, Sc, Y, Ti, Zr, Hf, V, Nb, Ta, Cr, Mo, W, Mn, Re, Fe, Ro, Os, Co, Rh, Ir, Ni, Pd, Pt, Cu, Ag, Au, Zn, Cd, Hg, Al, Ga, In, Tl, Si, Ge, Sn, Pb, As, Sb, Bi, Ln. More preference is given to Mg, Ca, Al, In, Cu, Ta, Zn, Y, Sc, Ln, Zr, Ti, Fe, Ni and Co. In particular preference is given to Cu, Ta, Zn, Al, Mg, Ti, Y, Fe, especially Cu, Zn and Al. With respect to the ions of these elements, those which may particularly be mentioned are $Mg^{2+}$, $Ca^{2+}$, $Sr^{2+}$, $Ba^{2+}$, $Sc^{3+}$, $Y^{3+}$, $Ti^{4+}$, $Zr^{4+}$, $Hf^{4+}$, $V^{4+}$, $V^{3+}$, $V^{2+}$, $Nb^{3+}$, $Ta^{3+}$, $Cr^{3+}$, $Mo^{3+}$, $W^{3+}$, $Mn^{3+}$, $Mn^{2+}$, $Re^{3+}$, $Re^{2+}$, $Fe^{3+}$, $Fe^{2+}$, $Ru^{3+}$, $Ru^{2+}$, $Os^{3+}$, $Os^{2+}$, $Co^{3+}$, $Co^{2+}$, $Rh^{2+}$, $Rh^{+}$, $Ir^{2+}$, $Ir^{+}$, $Ni^{2+}$, $Ni^{+}$, $Pd^{2+}$, $Pd^{+}$, $Pt^{2+}$, $Pt^{+}$, $Cu^{2+}$, $Cu^{+}$, $Ag^{+}$, $Au^{+}$, $Zn^{2+}$, $Cd^{2+}$, $Hg^{2+}$, $Al^{3+}$, $Ga^{3+}$, $In^{3+}$, $Tl^{3+}$, $Si^{4+}$, $Si^{2+}$, $Ge^{4+}$, $Ge^{2+}$, $Sn^{4+}$, $Sn^{2+}$, $Pb^{4+}$, $Pb^{2+}$, $As^{5+}$, $As^{3+}$, $As^{+}$, $Sb^{5+}$, $Sb^{3+}$, $Sb^{+}$, $Bi^{5+}$, $Bi^{3+}$, $Bi^{+}$ and $Ln^{3+}$.

Lanthanides (Ln) are Ce, Pr, Nd, Pm, Sm, Eu, Gd, Tb, Dy, Ho, Er, Tm, Yb and La.

The term "at least bidentate organic compound" designates an organic compound, which comprises at least one functional group, which is able to form, to a given metal ion, at least two, preferably two coordinate, bonds and/or to two or more, preferably two, metal atoms in each case one coordinate bond.

As functional groups via which said coordinate bonds can be developed, in particular the following functional groups may be mentioned by way of example: —$CO_2H$, —$CS_2H$, —$NO_2$, —$B(OH)_2$, —$SO_3H$, —$Si(OH)_3$, —$Ge(OH)_3$, —$Sn(OH)_3$, —$Si(SH)_4$, —$Ge(SH)_4$, —$Sn(SH)_3$, —$PO_3H$, —$AsO_3H$, —$AsO_4H$, —$P(SH)_3$, —$As(SH)_3$, —$CH(RSH)_2$, —$C(RSH)_3$, —$CH(RNH_2)_2$, —$C(RNH_2)_3$, —$CH(ROH)_2$, —$C(ROH)_3$, —$CH(RCN)_2$, —$C(RCN)_3$, in which R, for example, can preferably be an alkylene group having 1, 2, 3, 4 or 5 carbon atoms such as, for example, a methylene, ethylene, n-propylene, isopropylene, n-butylene, isobutylene, tert-butylene or n-pentylene group, or an aryl group comprising one or two aromatic nuclei, such as, for example, 2 $C_6$ rings which can, if appropriate, be condensed and independently of one another can be suitably substituted with at least in each case one substituent, and/or which, independently of one another, can each comprise at least one heteroatom, such as, for example, N, O and/or S. According to likewise preferred embodiments, functional groups may be mentioned in which the abovementioned radical R is not present. In this respect, inter alia, —$CH(SH)_2$, —$C(SH)_3$, —$CH(NH_2)_2$, —$C(NH_2)_3$, $CH(OH)_2$, —$C(OH)_3$, —$CH(CN)_2$ or —$C(CN)_3$ may be mentioned.

The at least two functional groups can in principle be bound to any suitable organic compound provided that it is ensured that the organic compound having these functional groups is capable of forming the coordinate bond and for producing the framework material.

Preferably, the organic compounds which comprise the at least two functional groups are derived from a saturated or unsaturated aliphatic compound or an aromatic compound or a compound which is both aliphatic and aromatic.

The aliphatic compound or the aliphatic part of the compound which is both aliphatic and aromatic can be linear and/or branched and/or cyclic, a plurality of cycles per compound also being possible. Further preferably, the aliphatic compound or the aliphatic part of the compound which is both aliphatic and aromatic comprises 1 to 15, further preferably 1 to 14, further preferably 1 to 13, further preferably 1 to 12, further preferably 1 to 11, and in particular preferably 1 to 10, carbon atoms, such as, for example, 1, 2, 3, 4, 5, 6, 7, 8, 9 or 10 carbon atoms. In particular preference is given in this case to, inter alia, methane, adamantane, acetylene, ethylene or butadiene.

The aromatic compound or the aromatic part of the compound, which is both aromatic and aliphatic can have one or else a plurality of nuclei, such as, for example, two, three, four or five nuclei, the nuclei being able to be present separately from one another and/or at least two nuclei in condensed form. Particularly preferably, the aromatic compound or the aromatic part of the compound, which is both aliphatic and aromatic has one, two or three nuclei, one or two nuclei being particularly preferred. Independently of one another, in addition, each nucleus of said compound can comprise at least one heteroatom, such as, for example, N, O, S, B, P, Si, Al, preferably N, O and/or S. Further preferably, the aromatic compound or the aromatic part of the compound which is both aromatic and aliphatic comprises one or two $C_6$ nuclei, the two either being present separately of one another or in condensed form. In particular, as aromatic compounds, mention may be made of benzene, naphthalene and/or biphenyl and/or bipyridyl and/or pyridyl.

Particularly preferably, the at least bidentate, organic compound is derived from a di-, tri-, or tetracarboxylic acid.

The term "derive" in the context of the present invention means that the at least bidentate, organic compound in the framework material can be present in partly deprotonated or completely deprotonated form or as sulfur analog. In addition, the at least bidentate, organic compound can comprise further substituents such as, for example, —OH, —$NH_2$, —$OCH_3$, —$NH(CH_3)$, —$N(CH_3)_2$, —CN and also halides. Sulfur analogs are the functional groups —C(=O)SH and also their tautomers and C(=S)SH, which can be used instead of one or more carboxylic acid groups.

For example, in the context of the present invention, mention may be made of dicarboxylic acids, such as oxalic acid, succinic acid, tartaric acid, 1,4-butanedicarboxylic acid, 4-oxopyran-2,6-dicarboxylic acid, 1,6-hexanedicarboxylic acid, decanedicarboxylic acid, 1,8-heptadecanedicarboxylic acid, 1,9-heptadecanedicarboxylic acid, heptadecanedicarboxylic acid, acetylenedicarboxylic acid, 1,2-benzenedicarboxylic acid, 2,3-pyridinedicarboxylic acid, pyridine-2,3-dicarboxylic acid, 1,3-butadiene-1,4-dicarboxylic acid, 1,4-benzenedicarboxylic acid, p-benzenedicarboxylic acid, imidazole-2,4-dicarboxylic acid, 2-methylquinoline-3,4-dicarboxylic acid, quinoline-2,4-dicarboxylic acid, quinoxaline-2,3-dicarboxylic acid, 6-chloroquinoxaline-2,3-dicarboxylic acid, 4,4'-diaminophenylmethane-3,3'-dicarboxylic acid, quinoline-3,4-dicarboxylic acid, 7-chloro-4-hydroxyquinoline-2,8-dicarboxylic acid, diimidodicarboxylic acid, pyridine-2,6-dicarboxylic acid, 2-methylimidazole-4,5-dicarboxylic acid, thiophene-3,4-dicarboxylic acid, 2-isopropylimidazole-4,5-dicarboxylic acid, tetrahydropyran-4,4-dicarboxylic acid, perylene-3,9-dicarboxylic acid, perylenedicarboxylic acid, Pluriol E 200 dicarboxylic acid, 3,6-dioxaoctanedicarboxylic acid, 3,5-cyclohexadiene-1,2-dicarboxylic acid, octadicarboxylic acid, pentane-3,3-carboxylic acid, 4,4'-diamino-1,1'-biphenyl-3,3'-dicarboxylic acid, 4,4'-diaminobiphenyl-3,3'-dicarboxylic acid, benzidine-3,3'-dicarboxylic acid, 1,4-bis(phenylamino)benzene-2,5-dicarboxylic acid, 1,1'-binaphthyl-5,5'-dicarboxylic acid, 7-chloro-8-methylquinoline-2,3-dicarboxylic acid, 1-anilinoanthraquinone-2,4'-dicarboxylic acid, polytetrahydrofuran-250-dicarboxylic acid, 1,4-bis(carboxymethyl)piperazine-2,3-dicarboxylic acid, 7-chloroquinoline-3,8-dicarboxylic acid, 1-(4-carboxy)phenyl-3-(4-chloro)phenylpyrazoline-4,5-dicarboxylic acid, 1,4,5,6,7,7-hexachloro-5-norbornene-2,3-dicarboxylic acid, phenylindanedicarboxylic acid, 1,3-dibenzyl-2-oxoimidazolidine-4,5-dicarboxylic acid, 1,4-cyclohexanedicarboxylic acid, naphthalene-1,8-dicarboxylic acid, 2-benzoylbenzene-1,3-dicarboxylic acid, 1,3-dibenzyl-2-oxoimidazolidine-4,5-cisdicarboxylic acid, 2,2'-biquinoline-4,4'-dicarboxylic acid, pyridine-3,4-dicarboxylic acid, 3,6,9-trioxaundecanedicarboxylic acid, O-hydroxybenzophenonedicarboxylic acid, Pluriol E 300 dicarboxylic acid, Pluriol E 400 dicarboxylic acid, Pluriol E 600 dicarboxylic acid, pyrazole-3,4-dicarboxylic acid, 2,3-pyrazinedicarboxylic acid, 5,6-dimethyl-2,3-pyrazinedicarboxylic acid, 4,4'-diaminodiphenyl ether diimidodicarboxylic acid, 4,4'-diaminodiphenylmethane diimidodicarboxylic acid, 4,4'-diaminodiphenyl sulfone diimidodicarboxylic acid, 2,6-naphthalenedicarboxylic acid, 1,3-adamantanedicarboxylic acid, 1,8-naphthalenedicarboxylic acid, 2,3-naphthalenedicarboxylic acid, 8 methoxy-2,3-naphthalenedicarboxylic acid, 8-nitro-2,3-naphthalenecarboxylic acid, 8-sulfo-2,3-naphthalenedicarboxylic acid, anthracene-2,3-dicarboxylic acid, 2',3'-diphenyl-p-terphenyl-4,4''-dicarboxylic acid, diphenyl ether-4,4'-dicarboxylic acid, imidazole-4,5-dicarboxylic acid, 4(1H)-oxothiochromene-2,8-dicarboxylic acid, 5-tert-butyl-1,3-benzenedicarboxylic acid, 7,8-quinolinedicarboxylic acid, 4,5-imidazoledicarboxylic acid, 4-cyclohexene-1,2-dicarboxylic acid, hexatriacontanedicarboxylic acid, tetradecanedicarboxylic acid, 1,7-heptadicarboxylic acid, 5-hydroxy-1,3-benzenedicarboxylic acid, pyrazine-2,3-dicarboxylic acid, furan-2,5-dicarboxylic acid, 1-nonene-6,9-dicarboxylic acid, eicosenedicarboxylic acid, 4,4'-dihydroxydiphenylmethane-3,3'-dicarboxylic acid, 1-amino-4-methyl-9,10-dioxo-9,10-dihydroanthracene-2,3-dicarboxylic acid, 2,5-pyridinedicarboxylic acid, cyclohexene-2,3-dicarboxylic acid, 2,9-dichlorofluororubine-4,11-dicarboxylic acid, 7-chloro-3-methylquinoline-6,8-dicarboxylic acid, 2,4-dichlorobenzophenone-2',5'-dicarboxylic acid, 1,3-benzenedicarboxylic acid, 2,6-pyridinedicarboxylic acid, 1-methylpyrrole-3,4-dicarboxylic acid, 1-benzyl-1H-pyrrole-3,4-dicarboxylic acid, anthraquinone-1,5-dicarboxylic acid, 3,5-pyrazoledicarboxylic acid, 2-nitrobenzene-1,4-dicarboxylic acid, heptane-1,7-dicarboxylic acid, cyclobutane-1,1-dicarboxylic acid, 1,14-tetradecanedicarboxylic acid, 5,6-dehydronorbornane-2,3-dicarboxylic acids, or 5-ethyl-2,3-pyridinedicarboxylic acid, tricarboxylic acid, such as
2-hydroxy-1,2,3-propanetricarboxylic acid, 7-chloro-2,3,8-quinolinetricarboxylic acid, 1,2,4-benzenetricarboxylic acid, 1,2,4-butanetricarboxylic acid, 2-phosphono-1,2,4-butanetricarboxylic acid, 1,3,5-benzenetricarboxylic acid, 1-hydroxy-1,2,3-propanetricarboxylic acid, 4,5-dihydro-4,5-dioxo-1H-pyrrolo[2,3-F]quinoline-2,7,9-tricarboxylic acid, 5-acetyl-3-amino-6-methylbenzene-1,2,4-tricarboxylic acid, 3-amino-5-benzoyl-6-methylbenzene-1,2,4-tricarboxylic acid, 1,2,3-propanetricarboxylic acid or aurintricarboxylic acid, or tetracarboxylic acids, such as
perylo[1,12-BCD]thiophene-1,1-dioxide-3,4,9,10-tetracarboxylic acid, perylenetetracarboxylic acids such as perylene-3,4,9,10-tetracarboxylic acid or perylene 1,12-sulfone-3,4,9,10-tetracarboxylic acid, butanetetracarboxylic acid such as 1,2,3,4-butanetetracarboxylic acid or meso-1,2,3,4-butanetetracarboxylic acid, decane-2,4,6,8-tetracarboxylic acid, 1,4,7,10,13,16-hexaoxacyclooctadecane-2,3,11,12-tetracarboxylic acid, 1,2,4,5-benzenetetracarboxylic acid, 1,2,11,12-dodecanetetracarboxylic acid, 1,2,5,6-hexanetetracarboxylic acid, 1,2,7,8-octanetetracarboxylic acid, 1,4,5,8-naphthalenetetracarboxylic acid, 1,2,9,10-decanetetracarboxylic acid, benzophenonetetracarboxylic acid, 3,3',4,4'-benzophenonetetracarboxylic acid, tetrahydrofurantetracarboxylic acid or cyclopentanetetracarboxylic acids such as cyclopentane-1,2,3,4-tetracarboxylic acid.

Very particularly preferably, use is made of, if appropriate at least mono-substituted, mono-, di-, tri-, tetra-nuclear or higher nuclear aromatic di-, tri- or tetra-carboxylic acids, with each of the nuclei being able to comprise at least one heteroatom, with two or more nuclei being able to comprise identical or different heteroatoms. For example, preference is given to mononuclear dicarboxylic acids, mononuclear tricarboxylic acids, mononuclear tetra-carboxylic acids, dinuclear dicarboxylic acids, dinuclear tricarboxylic acids, dinuclear tetracarboxylic acids, trinuclear dicarboxylic acids, trinuclear tricarboxylic acids, trinuclear tetracarboxylic acids, tetranuclear dicarboxylic acids, tetranuclear tricarboxylic acids and/or tetranuclear tetracarboxylic acids. Suitable heteroatoms are, for example, N, O, S, B, P, Si, Al, preferred heteroatoms here are N, S, and/or O. A suitable substituent, which may be mentioned in this respect, is, inter alia, —OH, a nitro group, an amino group or an alkyl or alkoxy group.

In particular preferably, as at least bidentate, organic compounds, use is made of acetylenedicarboxylic acid (ADC), benzenedicarboxylic acids, naphthalenedicarboxylic acids, biphenyldicarboxylic acids, such as, for example, 4,4'-biphenyldicarboxylic acid (BPDC), bipyridinedicarboxylic acids, such as, for example, 2,2'-bipyridinedicarboxylic acids, such as, for example, 2,2'-bipyridine-5,5'-dicarboxylic acid, benzenetricarboxylic acids, such as, for example, 1,2,3-benzenetricarboxylic acid or 1,3,5-benzenetricarboxylic acid (BTC), adamantane tetracarboxylic acid (ATC), adamantane dibenzoate (ADB), benzene tribenzoate (BTB), methane tetrabenzoate (MTB), adamantane tetrabenzoate or dihydroxyterephthalic acids, such as, for example, 2,5-dihydroxyterephthalic acid (DHBDC).

Very particularly preferably, use is made of, inter alia, isophthalic acid, terephthalic acid, 2,5-dihydroxyterephthalic acid, 1,2,3-benzenetricarboxylic acid, 1,3,5-benzenetricarboxylic acid or 2,2'-bipyridine-5,5'-dicarboxylic acid.

Further suitable at least bidentate organic compounds are monocyclic, bicyclic or polycyclic ring systems, which are derived from at least one heterocycle selected from the group consisting of pyrrole, α-pyridone and which have at least two ring nitrogens. These systems are unsubstituted or substituted with one or more substituents selected independently from the group consisting of halogen, $C_{1-6}$-alkyl, phenyl, $NH_2$, $NH(C_{1-6}$-alkyl), $N(C_{1-6}$-alkyl)$_2$, OH, O-phenyl and O—$C_{1-6}$-alkyl, where the substituents $C_{1-6}$-alkyl and phenyl are unsubstituted or substituted with one or more substituents selected independently from the group consisting of halogen, $NH_2$, $NH(C_{1-6}$-alkyl), $N(C_{1-6}$-alkyl)$_2$, OH, O-phenyl and O—$C_{1-6}$-alkyl. These compounds are also preferred.

For the purposes of the present invention, the term "$C_{1-6}$-alkyl" refers to an alkyl group having from 1 to 6 carbon atoms. Examples are methyl, ethyl, n-propyl, i-propyl, n-butyl, i-butyl, sec-butyl, t-butyl, pentyl, hexyl. Preferred radicals are methyl and ethyl. If a substituted $C_{1-6}$-alkyl radical is present, at least one hydrogen atom is replaced by another substituent.

Furthermore, for the purposes of the present invention, the term "halogen" refers to fluorine, chlorine, bromine or iodine. Preference is given to fluorine and chlorine.

As indicated above, the organic compound is a monocyclic, bicyclic or polycylic ring system which is derived from at least one heterocycle selected from the group consisting of pyrrole, alpha-pyridone and gamma-pyridone. All these three heterocycles have a ring nitrogen which in at least one limiting structure bears a hydrogen atom which can be split off. It is thus possible to deprotonate pyrrole, alpha-pyridone or gamma-pyridone. This forms a negative charge, which can at least partly balance the positive charge of the at least one metal ion of the metal-organic framework or metal ions from a metal surface to be polished.

For the purposes of the present invention, the term "derive" means that the monocyclic, bicyclic or polycyclic ring system has at least one substructure which corresponds to pyrrole, alpha-pyridone or gamma-pyridone. Furthermore, two or all three heterocycles can also be present as substructure in the ring system.

For the purposes of the present invention, the term "derive" also means that the three abovementioned heterocycles can occur not in neutral form but, if appropriate, also as anion or cation.

Furthermore, for the purposes of the present invention, the term "derive" means that the substructure of at least one of the three heterocycles can bear substituents as indicated above and one or more ring carbons can be replaced by a heteroatom.

Of course, the ring system can also be one of the heterocycles pyrrole, alpha-pyridone or gamma-pyridone itself or the ring system can likewise be made up of substructures which are selected exclusively from the group consisting of pyrrole, alpha-pyridone and gamma-pyridone. In this case too, the above-described modifications are possible.

Finally, it should be noted that at least one hydrogen which in at least one limiting structure is not the hydrogen bound to said nitrogen is replaced by a bond by means of which the respective heterocycle is bound to the remainder of the ring system.

If a monocyclic ring system is present, this is derived from pyrrole or alpha-pyridone or gamma-pyridone.

However, the ring system can also be a bicyclic ring system. This is the case when, for example, two rings which are joined to one another via a covalent single bond or via a group R are present in the ring system. Here, one ring has to be derived from pyrrole, alpha-pyridone or gamma-pyridone.

R can be —O—, —NH—, —S—, —N=N— or an aliphatic branched or unbranched saturated or unsaturated hydrocarbon which has from 1 to 4 carbon atoms and may be interrupted by one or more atoms or functional groups selected independently from the group consisting of —O—, —NH—, —S— and —N=N—.

Furthermore, the bicyclic ring system can be a fused ring system.

Examples are, in particular, benzo-fused derivatives derived from pyrrole, alpha-pyridone and gamma-pyridone.

In addition, the bicyclic ring system can be a bridged ring system.

The ring system can likewise be a polycyclic ring system which has, for example, 3, 4 or more rings. Here, the rings can be joined via a covalent single bond and/or a group R and/or be fused and/or be present as a bridged ring system.

The ring system has at least two ring nitrogens. Here, at least one of the two ring nitrogens is that nitrogen which is present in the ring derived from pyrrole, alpha-pyridone or gamma-pyridone. In addition, at least one further ring nitrogen has to be present. If the ring system is one which has more than one ring, the at least second ring nitrogen can also be present in the ring derived from pyrrole, alpha-pyridone or gamma-pyridone or, if the at least one further ring is not derived from one of these three heterocycles, may be located in this ring.

The at least two ring nitrogens are preferably present in one ring of the ring system.

In this case, the ring is derived from pyrazole, imidazole, pyridazin-2-one or pyrimidin-2-one or pyrimidin-4-one.

In addition to the two ring nitrogens, further ring nitrogens can be present. For example, the ring system can have 3, 4, 5 or more ring nitrogens.

If more than two ring nitrogens are present, all ring nitrogens can be present in one ring of the ring system or can be distributed over more than one ring up to all rings of the ring system.

If, for example, three ring nitrogens are present, these are also preferably present in the ring, which is derived from pyrrole, alpha-pyridone or gamma-pyridone. The resulting substructure of the ring can then be derived, for example, from a triazole, such as 1,2,3-triazole or 1,2,4-triazole.

In addition, the ring system can have further heteroatoms in the ring. These can be, for example, oxygen or sulfur. However, preference is given to no further heteroatoms in addition to nitrogen being present.

If the ring system has more than one ring, this ring can be saturated or unsaturated. The at least one further ring preferably has an at least partially conjugated double bond system or is aromatic in nature.

The ring system can be unsubstituted.

The ring system can also have one or more substituents. If a plurality of substituents are present, these can be identical or different.

The substituents bound to the ring system can be halogen, $C_{1-6}$-alkyl, phenyl, $NH_2$, $NH(C_{1-6}$-alkyl), $N(C_{1-6}$-alkyl$)_2$, OH, O-phenyl or $OC_{1-6}$-alkyl.

If at least one of the abovementioned substituents of the ring system is a $C_{1-6}$-alkyl or phenyl, these can likewise be unsubstituted or bear one or more substituents. When a plurality of substituents are present, it is also possible here for them to be identical or different. These are selected from the group consisting of halogen, $NH_2$, $NH(C_{1-6}$-alkyl), $N(C_{1-6}$-alkyl), $N(C_{1-6}$-alkyl$)_2$, OH, O-phenyl and $OC_{1-6}$-alkyl.

If the group $C_{1-6}$-alkyl occurs more than once, these alkyl groups can be identical or different.

For the purposes of the present invention, the hydroxy or keto group of alpha-pyridone and gamma-pyridone is not counted as a substituent since this group is necessarily present in the ring in order to obtain, at least for one limiting structure, a ring nitrogen bound to hydrogen.

Preference is given to the substituents bound to the ring system having no further substituents.

Preferred substituents bound to the ring system are $C_{1-6}$-alkyl, phenyl, $NH_2$ and OH, $C_{1-6}$-alkyl and $NH_2$ are more preferred. Particular preference is given to $C_{1-6}$-alkyl.

In a further preferred embodiment, the ring system is selected from the group consisting of

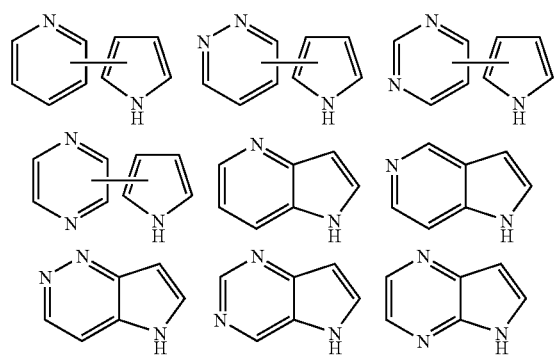

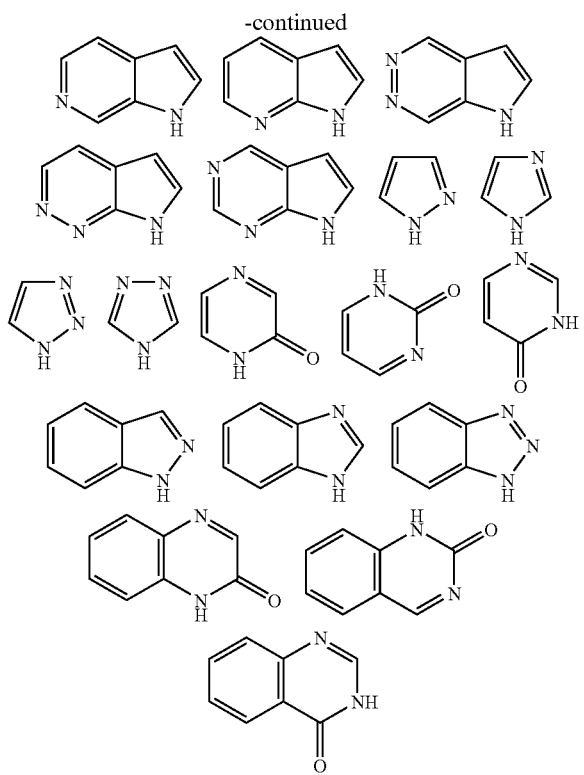

Further preferred ring systems are an imidazole, benzimidazole, triazole, 2-hydroxypyrimidine or 4-hydroxypyrimidine.

The at least one organic compound is very particularly preferably selected from the group consisting of 2-methylimidazole, 2-ethylimidazole, benzimidazole, 1,2,4-triazole, 3-amino-1,2,4-triazole, 3,5-diamino-1,2,4-triazole, 2-hydroxypyrimidine and 4-hydroxypyrimidine and their deprotonated forms.

Suitable solvents for producing the MOF are, inter alia, ethanol, dimethylformamide, toluene, methanol, chlorobenzene, diethylformamide, dimethyl sulfoxide, water, hydrogen peroxide, methylamine, sodium hydroxide solution, N-methylpolidone ether, acetonitrile, benzyl chloride, triethylamine, ethylene glycol and mixtures thereof. Further metal ions, at least bidentate, organic compounds, and solvents for the production of MOF are described, inter alia, in U.S. Pat. No. 5,648,508 or DE-A 101 11 230.

The pore size of the metal-organic framework material can be controlled by selection of suitable ligands and/or the at least bidentate, organic compound. In general it is true that the larger the organic compound, the larger the pore size. Preferably, the pore size is from 0.5 nm to 30 nm, particularly preferably the pore size is in the range from 0.9 nm to 3 nm, based on the crystalline material.

The pore volume (determined by Ar) is preferably at least 0.2 ml/g, more preferred at least 0.3 ml/g and most preferred at least 0.45 ml/g.

The pore distribution can be determined by means of mercury porosimetry.

Examples of MOFs are given below. In addition to the designation of the MOF, the metal and also the at least bidentate ligand, furthermore the solvent and also the cell parameters (angles α, β and γ, and also the distances A, B and C in Å) are reported. The latter were determined by X-ray diffraction.

| MOF-n | Constituents molar ratio M + L | Solvents | α | β | γ | a | b | c | Space group |
|---|---|---|---|---|---|---|---|---|---|
| MOF-0 | Zn(NO$_3$)$_2$·6H$_2$O H$_3$(BTC) | Ethanol | 90 | 90 | 120 | 16.711 | 16.711 | 14.189 | P6(3)/Mcm |
| MOF-2 | Zn(NO$_3$)$_2$·6H$_2$O (0.246 mmol) H$_2$(BDC) 0.241 mmol) | DMF Toluene | 90 | 102.8 | 90 | 6.718 | 15.49 | 12.43 | P2(1)/n |
| MOF-3 | Zn(NO$_3$)$_2$·6H$_2$O (1.89 mmol) H$_2$(BDC) (1.93 mmol) | DMF MeOH | 99.72 | 111.11 | 108.4 | 9.726 | 9.911 | 10.45 | P-1 |
| MOF-4 | Zn(NO$_3$)$_2$·6H$_2$O (1.00 mmol) H$_3$(BTC) (0.5 mmol) | Ethanol | 90 | 90 | 90 | 14.728 | 14.728 | 14.728 | P2(1)3 |
| MOF-5 | Zn(NO$_3$)$_2$·6H$_2$O (2.22 mmol) H$_2$(BDC) (2.17 mmol) | DMF Chlorobenzene | 90 | 90 | 90 | 25.669 | 25.669 | 25.669 | Fm-3m |
| MOF-38 | Zn(NO$_3$)$_2$·6H$_2$O (0.27 mmol) H$_3$(BTC) (0.15 mmol) | DMF Chlorobenzene | 90 | 90 | 90 | 20.657 | 20.657 | 17.84 | I4cm |
| MOF-31 Zn(ADC)$_2$ | Zn(NO$_3$)$_2$·6H$_2$O 0.4 mmol H$_2$(ADC) 0.8 mmol | Ethanol | 90 | 90 | 90 | 10.821 | 10.821 | 10.821 | Pn(-3)m |
| MOF-12 Zn$_2$(ATC) | Zn(NO$_3$)$_2$·6H$_2$O 0.3 mmol H$_4$(ATC) 0.15 mmol | Ethanol | 90 | 90 | 90 | 15.745 | 16.907 | 18.167 | Pbca |

| MOF-n | Constituents molar ratio M + L | Solvents | α | β | γ | a | b | c | Space group |
|---|---|---|---|---|---|---|---|---|---|
| MOF-20 ZnNDC | Zn(NO₃)₂·6H₂O 0.37 mmol H₂NDC 0.36 mmol | DMF Chlorobenzene | 90 | 92.13 | 90 | 8.13 | 16.444 | 12.807 | P2(1)/c |
| MOF-37 | Zn(NO₃)₂·6H₂O 0.2 mmol H₂NDC 0.2 mmol | DEF Chlorobenzene | 72.38 | 83.16 | 84.33 | 9.952 | 11.576 | 15.556 | P-1 |
| MOF-8 Tb₂(ADC) | Tb(NO₃)₃·5H₂O 0.10 mmol H₂ADC 0.20 mmol | DMSO MeOH | 90 | 115.7 | 90 | 19.83 | 9.822 | 19.183 | C2/c |
| MOF-9 Tb₂(ADC) | Tb(NO₃)₃·5H₂O 0.08 mmol H₂ADB 0.12 mmol | DMSO | 90 | 102.09 | 90 | 27.056 | 16.795 | 28.139 | C2/c |
| MOF-6 | Tb(NO₃)₃·5H₂O 0.30 mmol H₂(BDC) 0.30 mmol | DMF MeOH | 90 | 91.28 | 90 | 17.599 | 19.996 | 10.545 | P21/c |
| MOF-7 | Tb(NO₃)₃·5H₂O 0.15 mmol H₂(BDC) 0.15 mmol | H₂O | 102.3 | 91.12 | 101.5 | 6.142 | 10.069 | 10.096 | P-1 |
| MOF-69A | Zn(NO₃)₂·6H₂O 0.083 mmol 4,4'-BPDC 0.041 mmol | DEF H₂O₂ MeNH₂ | 90 | 111.6 | 90 | 23.12 | 20.92 | 12 | C2/c |
| MOF-69B | Zn(NO₃)₂·6H₂O 0.083 mmol 2,6-NCD 0.041 mmol | DEF H₂O₂ MeNH₂ | 90 | 95.3 | 90 | 20.17 | 18.55 | 12.16 | C2/c |
| MOF-11 Cu₂(ATC) | Cu(NO₃)₂·2.5H₂O 0.47 mmol H₂ATC 0.22 mmol | H₂O | 90 | 93.86 | 90 | 12.987 | 11.22 | 11.336 | C2/c |
| MOF-11 Cu₂(ATC) dehydr. | | | 90 | 90 | 90 | 8.4671 | 8.4671 | 14.44 | P42/mmc |
| MOF-14 Cu₃(BTB) | Cu(NO₃)₂·2.5H₂O 0.28 mmol H₃BTB 0.052 mmol | H₂O DMF EtOH | 90 | 90 | 90 | 26.946 | 26.946 | 26.946 | Im-3 |
| MOF-32 Cd(ATC) | Cd(NO₃)₂·4H₂O 0.24 mmol H₄ATC 0.10 mmol | H₂O NaOH | 90 | 90 | 90 | 13.468 | 13.468 | 13.468 | P(-4)3m |
| MOF-33 Zn₂(ATB) | ZnCl₂ 0.15 mmol H₄ATB 0.02 mmol | H₂O DMF EtOH | 90 | 90 | 90 | 19.561 | 15.255 | 23.404 | Imma |
| MOF-34 Ni(ATC) | Ni(NO₃)₂·6H₂O 0.24 mmol H₄ATC 0.10 mmol | H₂O NaOH | 90 | 90 | 90 | 10.066 | 11.163 | 19.201 | P2₁2₁2₁ |
| MOF-36 Zn₂(MTB) | Zn(NO₃)₂·4H₂O 0.20 mmol H₄MTB 0.04 mmol | H₂O DMF | 90 | 90 | 90 | 15.745 | 16.907 | 18.167 | Pbca |
| MOF-39 Zn₃O(HBTB) | Zn(NO₃)₂ 4H₂O 0.27 mmol H₃BTB 0.07 mmol | H₂O DMF EtOH | 90 | 90 | 90 | 17.158 | 21.591 | 25.308 | Pnma |
| NO305 | FeCl₂·4H₂O 5.03 mmol formic acid 86.90 mmol | DMF | 90 | 90 | 120 | 8.2692 | 8.2692 | 63.566 | R-3c |
| NO306A | FeCl₂·4H₂O 5.03 mmol formic acid 86.90 mmol | DEF | 90 | 90 | 90 | 9.9364 | 18.374 | 18.374 | Pbcn |
| NO29 MOF-0 similar | Mn(Ac)₂·4H₂O 0.46 mmol H₃BTC 0.69 mmol | DMF | 120 | 90 | 90 | 14.16 | 33.521 | 33.521 | P-1 |

-continued

| MOF-n | Constituents molar ratio M + L | Solvents | α | β | γ | a | b | c | Space group |
|---|---|---|---|---|---|---|---|---|---|
| BPR48 A2 | $Zn(NO_3)_2\ 6H_2O$ 0.012 mmol $H_2BDC$ 0.012 mmol | DMSO Toluene | 90 | 90 | 90 | 14.5 | 17.04 | 18.02 | Pbca |
| BPR69 B1 | $Cd(NO_3)_2\ 4H_2O$ 0.0212 mmol $H_2BDC$ 0.0428 mmol | DMSO | 90 | 98.76 | 90 | 14.16 | 15.72 | 17.66 | Cc |
| BPR92 A2 | $Co(NO_3)_2\cdot 6H_2O$ 0.018 mmol $H_2BDC$ 0.018 mmol | NMP | 106.3 | 107.63 | 107.2 | 7.5308 | 10.942 | 11.025 | P1 |
| BPR95 C5 | $Cd(NO_3)_2\ 4H_2O$ 0.012 mmol $H_2BDC$ 0.36 mmol | NMP | 90 | 112.8 | 90 | 14.460 | 11.085 | 15.829 | P2(1)/n |
| $Cu\ C_6H_4O_6$ | $Cu(NO_3)_2\cdot 2.5H_2O$ 0.370 mmol $H_2BDC(OH)_2$ 0.37 mmol | DMF Chloro-benzene | 90 | 105.29 | 90 | 15.259 | 14.816 | 14.13 | P2(1)/c |
| M(BTC) MOF-0 similar | $Co(SO_4)\ H_2O$ 0.055 mmol $H_3BTC$ 0.037 mmol | DMF | | as MOF-0 | | | | | |
| $Tb(C_6H_4O_6)$ | $Tb(NO_3)_3\cdot 5H_2O$ 0.370 mmol $H_2(C_6H_4O_6)$ 0.56 mmol | DMF Chloro-benzene | 104.6 | 107.9 | 97.147 | 10.491 | 10.981 | 12.541 | P-1 |
| $Zn\ (C_2O_4)$ | $ZnCl_2$ 0.370 mmol oxalic acid 0.37 mmol | DMF Chloro-benzene | 90 | 120 | 90 | 9.4168 | 9.4168 | 8.464 | P(-3)1m |
| Co(CHO) | $Co(NO_3)_2\cdot 5H_2O$ 0.043 mmol formic acid 1.60 mmol | DMF | 90 | 91.32 | 90 | 11.328 | 10.049 | 14.854 | P2(1)/n |
| Cd(CHO) | $Cd(NO_3)_2\cdot 4H_2O$ 0.185 mmol formic acid 0.185 mmol | DMF | 90 | 120 | 90 | 8.5168 | 8.5168 | 22.674 | R-3c |
| $Cu(C_3H_2O_4)$ | $Cu(NO_3)_2\cdot 2.5H_2O$ 0.043 mmol malonic acid 0.192 mmol | DMF | 90 | 90 | 90 | 8.366 | 8.366 | 11.919 | P43 |
| $Zn_6\ (NDC)_5$ MOF-48 | $Zn(NO_3)_2\cdot 6H_2O$ 0.097 mmol 14 NDC 0.069 mmol | DMF Chloro-benzene $H_2O_2$ | 90 | 95.902 | 90 | 19.504 | 16.482 | 14.64 | C2/m |
| MOF-47 | $Zn(NO_3)_2\ 6H_2O$ 0.185 mmol $H_2(BDC[CH_3]_4)$ 0.185 mmol | DMF Chloro-benzene $H_2O_2$ | 90 | 92.55 | 90 | 11.303 | 16.029 | 17.535 | P2(1)/c |
| MO25 | $Cu(NO_3)_2\cdot 2.5H_2O$ 0.084 mmol BPhDC 0.085 mmol | DMF | 90 | 112.0 | 90 | 23.880 | 16.834 | 18.389 | P2(1)/c |
| Cu-Thio | $Cu(NO_3)_2\cdot 2.5H_2O$ 0.084 mmol thiophene dicarboxylic acid 0.085 mmol | DEF | 90 | 113.6 | 90 | 15.4747 | 14.514 | 14.032 | P2(1)/c |
| ClBDC1 | $Cu(NO_3)_2\cdot 2.5H_2O$ 0.084 mmol $H_2(BDCCl_2)$ 0.085 mmol | DMF | 90 | 105.6 | 90 | 14.911 | 15.622 | 18.413 | C2/c |
| MOF-101 | $Cu(NO_3)_2\cdot 2.5H_2O$ 0.084 mmol BrBDC 0.085 mmol | DMF | 90 | 90 | 90 | 21.607 | 20.607 | 20.073 | Fm3m |
| $Zn_3(BTC)_2$ | $ZnCl_2$ 0.033 mmol $H_3BTC$ 0.033 mmol | DMF EtOH base added | 90 | 90 | 90 | 26.572 | 26.572 | 26.572 | Fm-3m |
| MOF-j | $Co(CH_3CO_2)_2\cdot 4H_2O$ (1.65 mmol) | $H_2O$ | 90 | 112.0 | 90 | 17.482 | 12.963 | 6.559 | C2 |

-continued

| MOF-n | Constituents molar ratio M + L | Solvents | α | β | γ | a | b | c | Space group |
|---|---|---|---|---|---|---|---|---|---|
| MOF-n | H₃(BZC) (0.95 mmol) Zn(NO₃)₂·6H₂O H₃ (BTC) | Ethanol | 90 | 90 | 120 | 16.711 | 16.711 | 14.189 | P6(3)/mcm |
| PbBDC | Pb(NO₃)₂ (0.181 mmol) H₂(BDC) (0.181 mmol) | DMF Ethanol | 90 | 102.7 | 90 | 8.3639 | 17.991 | 9.9617 | P2(1)/n |
| Znhex | Zn(NO₃)₂·6H₂O (0.171 mmol) H₃BTB (0.114 mmol) | DMF p-Xylene Ethanol | 90 | 90 | 120 | 37.1165 | 37.117 | 30.019 | P3(1)c |
| AS16 | FeBr₂ 0.927 mmol H₂(BDC) 0.927 mmol | DMF anhydr. | 90 | 90.13 | 90 | 7.2595 | 8.7894 | 19.484 | P2(1)c |
| AS27-2 | FeBr₂ 0.927 mmol H₃(BDC) 0.464 mmol | DMF anhydr. | 90 | 90 | 90 | 26.735 | 26.735 | 26.735 | Fm3m |
| AS32 | FeCl₃ 1.23 mmol H₂(BDC) 1.23 mmol | DMF anhydr. Ethanol | 90 | 90 | 120 | 12.535 | 12.535 | 18.479 | P6(2)c |
| AS54-3 | FeBr₂ 0.927 BPDC 0.927 mmol | DMF anhydr. n-Propanol | 90 | 109.98 | 90 | 12.019 | 15.286 | 14.399 | C2 |
| AS61-4 | FeBr₂ 0.927 mmol m-BDC 0.927 mmol | Pyridine anhydr. | 90 | 90 | 120 | 13.017 | 13.017 | 14.896 | P6(2)c |
| AS68-7 | FeBr₂ 0.927 mmol m-BDC 1.204 mmol | DMF anhydr. Pyridine | 90 | 90 | 90 | 18.3407 | 10.036 | 18.039 | Pca2₁ |
| Zn(ADC) | Zn(NO₃)₂·6H₂O 0.37 mmol H₂(ADC) 0.36 mmol | DMF Chlorobenzene | 90 | 99.85 | 90 | 16.764 | 9.349 | 9.635 | C2/c |
| MOF-12 Zn₂ (ATC) | Zn(NO₃)₂·6H₂O 0.30 mmol H₄(ATC) 0.15 mmol | Ethanol | 90 | 90 | 90 | 15.745 | 16.907 | 18.167 | Pbca |
| MOF-20 ZnNDC | Zn(NO₃)₂·6H₂O 0.37 mmol H₂NDC 0.36 mmol | DMF Chlorobenzene | 90 | 92.13 | 90 | 8.13 | 16.444 | 12.807 | P2(1)/c |
| MOF-37 | Zn(NO₃)₂·6H₂O 0.20 mmol H₂NDC 0.20 mmol | DEF Chlorobenzene | 72.38 | 83.16 | 84.33 | 9.952 | 11.576 | 15.556 | P-1 |
| Zn(NDC) (DMSO) | Zn(NO₃)₂·6H₂O H₂NDC | DMSO | 68.08 | 75.33 | 88.31 | 8.631 | 10.207 | 13.114 | P-1 |
| Zn(NDC) | Zn(NO₃)₂·6H₂O H₂NDC | | 90 | 99.2 | 90 | 19.289 | 17.628 | 15.052 | C2/c |
| Zn(HPDC) | Zn(NO₃)₂·4H₂O 0.23 mmol H₂(HPDC) 0.05 mmol | DMF H₂O | 107.9 | 105.06 | 94.4 | 8.326 | 12.085 | 13.767 | P-1 |
| Co(HPDC) | Co(NO₃)₂·6H₂O 0.21 mmol H₂ (HPDC) 0.06 mmol | DMF H₂O/ Ethanol | 90 | 97.69 | 90 | 29.677 | 9.63 | 7.981 | C2/c |
| Zn₃(PDC)2.5 | Zn(NO₃)₂·4H₂O 0.17 mmol H₂(HPDC) 0.05 mmol | DMF/ ClBz H₂0/ TEA | 79.34 | 80.8 | 85.83 | 8.564 | 14.046 | 26.428 | P-1 |
| Cd₂ (TPDC)2 | Cd(NO₃)₂·4H₂O 0.06 mmol H₂(HPDC) 0.06 mmol | Methanol/ CHP H₂O | 70.59 | 72.75 | 87.14 | 10.102 | 14.412 | 14.964 | P-1 |
| Tb(PDC)1.5 | Tb(NO₃)₃·5H₂O 0.21 mmol H₂(PDC) 0.034 mmol | DMF H₂O/ Ethanol | 109.8 | 103.61 | 100.14 | 9.829 | 12.11 | 14.628 | P-1 |

-continued

| MOF-n | Constituents molar ratio M + L | Solvents | α | β | γ | a | b | c | Space group |
|---|---|---|---|---|---|---|---|---|---|
| ZnDBP | $Zn(NO_3)_2 \cdot 6H_2O$ 0.05 mmol dibenzyl phosphate 0.10 mmol | MeOH | 90 | 93.67 | 90 | 9.254 | 10.762 | 27.93 | P2/n |
| $Zn_3$(BPDC) | $ZnBr_2$ 0.021 mmol 4,4'BPDC 0.005 mmol | DMF | 90 | 102.76 | 90 | 11.49 | 14.79 | 19.18 | P21/n |
| CdBDC | $Cd(NO_3)_2 \cdot 4H_2O$ 0.100 mmol $H_2$(BDC) 0.401 mmol | DMF $Na_2SiO_3$ (aq) | 90 | 95.85 | 90 | 11.2 | 11.11 | 16.71 | P21/n |
| Cd-mBDC | $Cd(NO_3)_2 \cdot 4H_2O$ 0.009 mmol $H_2$(mBDC) 0.018 mmol | DMF $MeNH_2$ | 90 | 101.1 | 90 | 13.69 | 18.25 | 14.91 | C2/c |
| $Zn_4$OBNDC | $Zn(NO_3)_2 \cdot 6H_2O$ 0.041 mmol BNDC | DEF $MeNH_2$ $H_2O_2$ | 90 | 90 | 90 | 22.35 | 26.05 | 59.56 | Fmmm |
| Eu(TCA) | $Eu(NO_3)_3 \cdot 6H_2O$ 0.14 mmol TCA 0.026 mmol | DMF Chlorobenzene | 90 | 90 | 90 | 23.325 | 23.325 | 23.325 | Pm-3n |
| Tb(TCA) | $Tb(NO_3)_3 \cdot 6H_2O$ 0.069 mmol TCA 0.026 mmol | DMF Chlorobenzene | 90 | 90 | 90 | 23.272 | 23.272 | 23.372 | Pm-3n |
| Formates | $Ce(NO_3)_3 \cdot 6H_2O$ 0.138 mmol formic acid 0.43 mmol | $H_2O$ Ethanol | 90 | 90 | 120 | 10.668 | 10.667 | 4.107 | R-3m |
| | $FeCl_2 \cdot 4H_2O$ 5.03 mmol formic acid 86.90 mmol | DMF | 90 | 90 | 120 | 8.2692 | 8.2692 | 63.566 | R-3c |
| | $FeCl_2 \cdot 4H_2O$ 5.03 mmol formic acid 86.90 mmol | DEF | 90 | 90 | 90 | 9.9364 | 18.374 | 18.374 | Pbcn |
| | $FeCl_2 \cdot 4H_2O$ 5.03 mmol formic acid 86.90 mmol | DEF | 90 | 90 | 90 | 8.335 | 8.335 | 13.34 | P-31c |
| NO330 | $FeCl_2 \cdot 4H_2O$ 0.50 mmol formic acid 8.69 mmol | Formamide | 90 | 90 | 90 | 8.7749 | 11.655 | 8.3297 | Pnna |
| NO332 | $FeCl_2 \cdot 4H_2O$ 0.50 mmol formic acid 8.69 mmol | DIP | 90 | 90 | 90 | 10.0313 | 18.808 | 18.355 | Pbcn |
| NO333 | $FeCl_2 \cdot 4H_2O$ 0.50 mmol formic acid 8.69 mmol | DBF | 90 | 90 | 90 | 45.2754 | 23.861 | 12.441 | Cmcm |
| NO335 | $FeCl_2 \cdot 4H_2O$ 0.50 mmol formic acid 8.69 mmol | CHF | 90 | 91.372 | 90 | 11.5964 | 10.187 | 14.945 | P21/n |
| NO336 | $FeCl_2 \cdot 4H_2O$ 0.50 mmol formic acid 8.69 mmol | MFA | 90 | 90 | 90 | 11.7945 | 48.843 | 8.4136 | Pbcm |
| NO13 | $Mn(Ac)_2 \cdot 4H_2O$ 0.46 mmol benzoic acid 0.92 mmol bipyridine 0.46 mmol | Ethanol | 90 | 90 | 90 | 18.66 | 11.762 | 9.418 | Pbcn |
| NO29 MOF-0 similar | $Mn(Ac)_2 \cdot 4H_2O$ 0.46 mmol $H_3$BTC 0.69 mmol | DMF | 120 | 90 | 90 | 14.16 | 33.521 | 33.521 | P-1 |
| $Mn(hfac)_2$ $(O_2CC_6H_5)$ | $Mn(Ac)_2 \cdot 4H_2O$ 0.46 mmol Hfac | Ether | 90 | 95.32 | 90 | 9.572 | 17.162 | 14.041 | C2/c |

-continued

| MOF-n | Constituents molar ratio M + L | Solvents | α | β | γ | a | b | c | Space group |
|---|---|---|---|---|---|---|---|---|---|
| | 0.92 mmol bipyridine 0.46 mmol | | | | | | | | |
| BPR43G2 | Zn(NO$_3$)$_2$·6H$_2$O 0.0288 mmol H$_2$BDC 0.0072 mmol | DMF CH$_3$CN | 90 | 91.37 | 90 | 17.96 | 6.38 | 7.19 | C2/c |
| BPR48A2 | Zn(NO$_3$)$_2$ 6H$_2$O 0.012 mmol H$_2$BDC 0.012 mmol | DMSO Toluene | 90 | 90 | 90 | 14.5 | 17.04 | 18.02 | Pbca |
| BPR49B1 | Zn(NO$_3$)$_2$ 6H$_2$O 0.024 mmol H$_2$BDC 0.048 mmol | DMSO Methanol | 90 | 91.172 | 90 | 33.181 | 9.824 | 17.884 | C2/c |
| BPR56E1 | Zn(NO$_3$)$_2$ 6H$_2$O 0.012 mmol H$_2$BDC 0.024 mmol | DMSO n-Propanol | 90 | 90.096 | 90 | 14.5873 | 14.153 | 17.183 | P2(1)/n |
| BPR68D10 | Zn(NO$_3$)$_2$ 6H$_2$O 0.0016 mmol H$_3$BTC 0.0064 mmol | DMSO Benzene | 90 | 95.316 | 90 | 10.0627 | 10.17 | 16.413 | P2(1)/c |
| BPR69B1 | Cd(NO$_3$)$_2$ 4H$_2$O 0.0212 mmol H$_2$BDC 0.0428 mmol | DMSO | 90 | 98.76 | 90 | 14.16 | 15.72 | 17.66 | Cc |
| BPR73E4 | Cd(NO$_3$)$_2$ 4H$_2$O 0.006 mmol H$_2$BDC 0.003 mmol | DMSO Toluene | 90 | 92.324 | 90 | 8.7231 | 7.0568 | 18.438 | P2(1)/n |
| BPR76D5 | Zn(NO$_3$)$_2$ 6H$_2$O 0.0009 mmol H$_2$BzPDC 0.0036 mmol | DMSO | 90 | 104.17 | 90 | 14.4191 | 6.2599 | 7.0611 | Pc |
| BPR80B5 | Cd(NO$_3$)$_2$·4H$_2$O 0.018 mmol H$_2$BDC 0.036 mmol | DMF | 90 | 115.11 | 90 | 28.049 | 9.184 | 17.837 | C2/c |
| BPR80H5 | Cd(NO$_3$)$_2$ 4H$_2$O 0.027 mmol H$_2$BDC 0.027 mmol | DMF | 90 | 119.06 | 90 | 11.4746 | 6.2151 | 17.268 | P2/c |
| BPR82C6 | Cd(NO$_3$)$_2$ 4H$_2$O 0.0068 mmol H$_2$BDC 0.202 mmol | DMF | 90 | 90 | 90 | 9.7721 | 21.142 | 27.77 | Fdd2 |
| BPR86C3 | Co(NO$_3$)$_2$ 6H$_2$O 0.0025 mmol H$_2$BDC 0.075 mmol | DMF | 90 | 90 | 90 | 18.3449 | 10.031 | 17.983 | Pca2(1) |
| BPR86H6 | Cd(NO$_3$)$_2$·6H$_2$O 0.010 mmol H$_2$BDC 0.010 mmol | DMF | 80.98 | 89.69 | 83.412 | 9.8752 | 10.263 | 15.362 | P-1 |
| | Co(NO$_3$)$_2$ 6H$_2$O | NMP | 106.3 | 107.63 | 107.2 | 7.5308 | 10.942 | 11.025 | P1 |
| BPR95A2 | Zn(NO$_3$)$_2$ 6H$_2$O 0.012 mmol H$_2$BDC 0.012 mmol | NMP | 90 | 102.9 | 90 | 7.4502 | 13.767 | 12.713 | P2(1)/c |
| CuC$_6$F$_4$O$_4$ | Cu(NO$_3$)$_2$·2.5H$_2$O 0.370 mmol H$_2$BDC(OH)$_2$ 0.37 mmol | DMF Chlorobenzene | 90 | 98.834 | 90 | 10.9675 | 24.43 | 22.553 | P2(1)/n |
| Fe Formic | FeCl$_2$·4H$_2$O 0.370 mmol formic acid 0.37 mmol | DMF | 90 | 91.543 | 90 | 11.495 | 9.963 | 14.48 | P2(1)/n |
| Mg Formic | Mg(NO$_3$)$_2$·6H$_2$O 0.370 mmol formic acid 0.37 mmol | DMF | 90 | 91.359 | 90 | 11.383 | 9.932 | 14.656 | P2(1)/n |
| MgC$_6$H$_4$O$_6$ | Mg(NO$_3$)$_2$·6H$_2$O 0.370 mmol H$_2$BDC(OH)$_2$ 0.37 mmol | DMF | 90 | 96.624 | 90 | 17.245 | 9.943 | 9.273 | C2/c |

-continued

| MOF-n | Constituents molar ratio M + L | Solvents | α | β | γ | a | b | c | Space group |
|---|---|---|---|---|---|---|---|---|---|
| Zn C$_2$H$_4$BDC MOF-38 | ZnCl$_2$ 0.44 mmol CBBDC 0.261 mmol | DMF | 90 | 94.714 | 90 | 7.3386 | 16.834 | 12.52 | P2(1)/n |
| MOF-49 | ZnCl$_2$ 0.44 mmol m-BDC 0.261 mmol | DMF CH$_3$CN | 90 | 93.459 | 90 | 13.509 | 11.984 | 27.039 | P2/c |
| MOF-26 | Cu(NO$_3$)$_2$·5H$_2$O 0.084 mmol DCPE 0.085 mmol | DMF | 90 | 95.607 | 90 | 20.8797 | 16.017 | 26.176 | P2(1)/n |
| MOF-112 | Cu(NO$_3$)$_2$·2.5H$_2$O 0.084 mmol o-Br-m-BDC 0.085 mmol | DMF Ethanol | 90 | 107.49 | 90 | 29.3241 | 21.297 | 18.069 | C2/c |
| MOF-109 | Cu(NO$_3$)$_2$·2.5H$_2$O 0.084 mmol KDB 0.085 mmol | DMF | 90 | 111.98 | 90 | 23.8801 | 16.834 | 18.389 | P2(1)/c |
| MOF-111 | Cu(NO$_3$)$_2$·2.5H$_2$O 0.084 mmol o-BrBDC 0.085 mmol | DMF Ethanol | 90 | 102.16 | 90 | 10.676 | 18.781 | 21.052 | C2/c |
| MOF-110 | Cu(NO$_3$)$_2$·2.5H$_2$O 0.084 mmol thiophene dicarboxylic acid 0.085 mmol | DMF | 90 | 90 | 120 | 20.0652 | 20.065 | 20.747 | R-3/m |
| MOF-107 | Cu(NO$_3$)$_2$·2.5H$_2$O 0.084 mmol thiophene dicarboxylic acid 0.085 mmol | DEF | 104.8 | 97.075 | 95.206 | 11.032 | 18.067 | 18.452 | P-1 |
| MOF-108 | Cu(NO$_3$)$_2$·2.5H$_2$O 0.084 mmol thiophene dicarboxylic acid 0.085 mmol | DBF/ Methanol | 90 | 113.63 | 90 | 15.4747 | 14.514 | 14.032 | C2/c |
| MOF-102 | Cu(NO$_3$)$_2$·2.5H$_2$O 0.084 mmol H$_2$(BDCCl$_2$) 0.085 mmol | DMF | 91.63 | 106.24 | 112.01 | 9.3845 | 10.794 | 10.831 | P-1 |
| Clbdc1 | Cu(NO$_3$)$_2$·2.5H$_2$O 0.084 mmol H$_2$(BDCCl$_2$) 0.085 mmol | DEF | 90 | 105.56 | 90 | 14.911 | 15.622 | 18.413 | P-1 |
| Cu(NMOP) | Cu(NO$_3$)$_2$·2.5H$_2$O 0.084 mmol NBDC 0.085 mmol | DMF | 90 | 102.37 | 90 | 14.9238 | 18.727 | 15.529 | P2(1)/m |
| Tb(BTC) | Tb(NO$_3$)$_3$·5H$_2$O 0.033 mmol H$_3$BTC 0.033 mmol | DMF | 90 | 106.02 | 90 | 18.6986 | 11.368 | 19.721 | |
| Zn$_3$(BTC)$_2$ | ZnCl$_2$ 0.033 mmol H$_3$BTC 0.033 mmol | DMF Ethanol | 90 | 90 | 90 | 26.572 | 26.572 | 26.572 | Fm-3m |
| Zn$_4$O(NDC) | Zn(NO$_3$)$_2$·4H$_2$O 0.066 mmol 14NDC 0.066 mmol | DMF Ethanol | 90 | 90 | 90 | 41.5594 | 18.818 | 17.574 | aba2 |
| CdTDC | Cd(NO$_3$)$_2$·4H$_2$O 0.014 mmol thiophene 0.040 mmol DABCO 0.020 mmol | DMF H$_2$O | 90 | 90 | 90 | 12.173 | 10.485 | 7.33 | Pmma |
| IRMOF-2 | Zn(NO$_3$)$_2$·4H$_2$O 0.160 mmol o-Br-BDC 0.60 mmol | DEF | 90 | 90 | 90 | 25.772 | 25.772 | 25.772 | Fm-3m |
| IRMOF-3 | Zn(NO$_3$)$_2$·4H$_2$O 0.20 mmol | DEF Ethanol | 90 | 90 | 90 | 25.747 | 25.747 | 25.747 | Fm-3m |

-continued

| MOF-n | Constituents molar ratio M + L | Solvents | α | β | γ | a | b | c | Space group |
|---|---|---|---|---|---|---|---|---|---|
| IRMOF-4 | H$_2$N-BDC 0.60 mmol Zn(NO$_3$)$_2$•4H$_2$O 0.11 mmol | DEF | 90 | 90 | 90 | 25.849 | 25.849 | 25.849 | Fm-3m |
| IRMOF-5 | [C$_3$H$_7$O]$_2$-BDC 0.48 mmol Zn(NO$_3$)$_2$•4H$_2$O 0.13 mmol | DEF | 90 | 90 | 90 | 12.882 | 12.882 | 12.882 | Pm-3m |
| IRMOF-6 | [C$_5$H$_{11}$O]$_2$-BDC 0.50 mmol Zn(NO$_3$)$_2$•4H$_2$O 0.20 mmol | DEF | 90 | 90 | 90 | 25.842 | 25.842 | 25.842 | Fm-3m |
| IRMOF-7 | [C$_2$H$_4$]-BDC 0.60 mmol Zn(NO$_3$)$_2$•4H$_2$O 0.07 mmol | DEF | 90 | 90 | 90 | 12.914 | 12.914 | 12.914 | Pm-3m |
| IRMOF-8 | 1,4NDC 0.20 mmol Zn(NO$_3$)$_2$•4H$_2$O 0.55 mmol | DEF | 90 | 90 | 90 | 30.092 | 30.092 | 30.092 | Fm-3m |
| IRMOF-9 | 2,6NDC 0.42 mmol Zn(NO$_3$)$_2$•4H$_2$O 0.05 mmol | DEF | 90 | 90 | 90 | 17.147 | 23.322 | 25.255 | Pnnm |
| IRMOF-10 | BPDC 0.42 mmol Zn(NO$_3$)$_2$•4H$_2$O 0.02 mmol | DEF | 90 | 90 | 90 | 34.281 | 34.281 | 34.281 | Fm-3m |
| IRMOF-11 | BPDC 0.012 mmol Zn(NO$_3$)$_2$•4H$_2$O 0.05 mmol | DEF | 90 | 90 | 90 | 24.822 | 24.822 | 56.734 | R-3m |
| IRMOF-12 | HPDC 0.20 mmol Zn(NO$_3$)$_2$•4H$_2$O 0.017 mmol | DEF | 90 | 90 | 90 | 34.281 | 34.281 | 34.281 | Fm-3m |
| IRMOF-13 | HPDC 0.12 mmol Zn(NO$_3$)$_2$•4H$_2$O 0.048 mmol | DEF | 90 | 90 | 90 | 24.822 | 24.822 | 56.734 | R-3m |
| IRMOF-14 | PDC 0.31 mmol Zn(NO$_3$)$_2$•4H$_2$O 0.17 mmol | DEF | 90 | 90 | 90 | 34.381 | 34.381 | 34.381 | Fm-3m |
| IRMOF-15 | PDC 0.12 mmol Zn(NO$_3$)$_2$•4H$_2$O 0.063 mmol | DEF | 90 | 90 | 90 | 21.459 | 21.459 | 21.459 | Im-3m |
| IRMOF-16 | TPDC 0.025 mmol Zn(NO$_3$)$_2$•4H$_2$O 0.0126 mmol TPDC 0.05 mmol | DEF NMP | 90 | 90 | 90 | 21.49 | 21.49 | 21.49 | Pm-3m |

ADC Acetylenedicarboxylic acid
NDC Naphthalenedicarboxylic acid
BDC Benzenedicarboxylic acid
ATC Adamantanetetracarboxylic acid
BTC Benzenetricarboxylic acid
BTB Benzenetribenzoic acid
MTB Methanetetrabenzoic acid
ATB Adamantanetetrabenzoic acid
ADB Adamantanedibenzoic acid Further metal-organic framework materials are MOF-2 to 4, MOF-9, MOF-31 to 36, MOF-39, MOF-69 to 80, MOF103 to 106, MOF-122, MOF-125, MOF-150, MOF-177, MOF-178, MOF-235, MOF-236, MOF-500, MOF-501, MOF-502, MOF-505, IRMOF-1, IRMOF-61, IRMOP-13, IRMOP-51, MIL-17, MIL-45, MIL-47, MIL-53, MIL-59, MIL-60, MIL-61, MIL-63, MIL-68, MIL-79, MIL-80, MIL-83, MIL-85, MIL-88, MIL 100, MIL 101, HKUST-1, CPL-1 to 2, SZL-1 which are described in the literature.

In particular preference is given to a porous metal-organic framework material in which Zn, Al or Cu is present as metal ion and the at least bidentate, organic compound is fumaric acid, glutaric acid, 2-methyl imidazole, 2-ethyl imidazole, benzimidazole, N-methyl benzimidazole, N-ethyl benzimidazole, triazole, aminotriazole, benzotriazole, terephthalic acid, isophthalic acid, 2,6-naphthalenedicarboxylic acid or 1,3,5-benzenetricarboxylic acid, in particular Mn— and Mg formate.

In addition to the conventional method for production of metal-organic framework materials, as described, for example in U.S. Pat. No. 5,648,508, they can also be produced by the electrochemical route. In this respect, reference is made to DE-A 103 55 087 and also WO-A 2005/049892. The metal-organic framework materials produced in this way exhibit particularly good properties in relation to adsorption and desorption of chemical substances, in particular gases. They thus differ from those which are produced conventionally, even when these are formed from the same organic and metal ion constituents and are therefore to be considered novel framework materials. In the context of the present invention, electrochemically produced metal-organic framework materials are particularly preferred. In particular suitable methods for producing metal-organic framework materials based on pyrrole and pyridone are described in WO-A 2007/131955.

Consequently, the electrochemical production relates to a crystalline porous metal-organic framework material comprising at least one at least bidentate, organic compound which is bound by coordination to at least one metal ion and which is obtained in a reaction medium comprising the at least one bidentate organic compound by at least one metal ion being generated by oxidation of at least one anode comprising the corresponding metal.

The term "electrochemical production" designates a production method in which the formation of at least one reaction product is associated with the migration of electric charges or the occurrence of electric potentials.

The term "at least one metal ion", as used in connection with the electrochemical production, designates embodiments according to which at least one ion of a metal or at least one ion of a first metal and at least one ion of at least one second metal different from the first metal are provided by anodic oxidation.

Consequently, the electrochemical production comprises embodiments in which at least one ion of at least one metal is provided by anodic oxidation and at least one ion of at least one metal is provided via a metal salt, the at least one metal in the metal salt and the at least one metal which is provided as metal ion via anodic oxidation can be identical or different from one another. Therefore the present invention, with respect to electrochemically produced metal-organic framework materials, comprises, for example, an embodiment according to which the reaction medium comprises one or more different salts of a metal and the metal ion present in this salt or in these salts is additionally provided by anodic oxidation of at least one anode comprising this metal. Likewise, the reaction medium can comprise one or more different salts of at least one metal and at least one metal different from these metals can be provided by anodic oxidation as metal ion in the reaction medium.

According to a preferred embodiment of the present invention in connection with the electrochemical production, the at least one metal ion is provided by anodic oxidation of at least one anode comprising this at least one metal, though no further metal being provided via a metal salt.

The term "metal", as used in the context of the present invention in connection with the electrochemical production of MOFs, comprises all elements of the Periodic Table of the Elements which can be provided via anodic oxidation via the electrochemical route in a reaction medium and together with at least one at least bidentate, organic compound are able to form at least one metal-organic porous framework material.

The abrasive particles of component A of the composition for chemical-mechanical polishing according to the present invention have preferably particle sizes in diameter ($d_{50}$) of less than 2 µm, more preferred less than 1 µm and even more preferred less than 0.1 µm. The value $d_{50}$ can be determined by laser diffraction using, e.g., a spectrometer Mastersizer S from Malvern. An adequate amount of the representative sample can be put into deionized water with a small amount of surfactant and dispersed by ultrasonic in the associated dispersing unit. After 5 minutes of ultrasonification the sample can be measured. Preferred are particles of spherical shape.

To obtain the desired particle size methods can be used which are well known in the art. In one embodiment the particle size is achieved directly from the preparation by choice of appropriate starting material, termination reagents and conditions during preparation and precipitation. Furthermore the yielded particles may be subjected to milling. Preferred is the electrochemical preparation.

Dry and wet milling is generally possible. Suitable mills are stirring mills, hammer mills and jet mills. Especially for particles in the sub-micrometer range, i.e. nanoparticles, by means of grinding can be carried out by milling in a liquid suspension in mills with a high stress intensity and a long residence time in the grinding chamber itself or in the grinding system consisting of mill and vessel. Therefore, vibration mills, planetary ball mills and stirred ball mills are suited. Planetary ball mills and stirred ball mills offer the higher grinding intensities wherefrom the planetary ball mill is mainly a pure laboratory mill. So, especially the stirred ball mill is used for the generation of nanoparticles.

Preferably, the tap density of the particle material is less than 2 kg/l, more preferred less than 1 kg/l and most preferred less than 0.5 kg/l. The tap density is preferably determined according to DIN ISO 3953.

The crystal density (determined by He adsorption) is preferably less than 3 kg/l, more preferred less than 2.5 kg/l.

As component B of the composition for the chemical-mechanical polishing a liquid carrier is used with 40% to 99.8% by weight based on the total amount of the composition. Preferably, the amount is in the range of 75% to 99%, more preferred 85% to 98.5%, even more preferred 90% to 98%, by weight based on the total amount of the composition.

The liquid carrier can comprise one or more liquids. Preferred are water and water-soluble liquids.

Examples for water-soluble liquids are alcohols like methanol, ethanol, propanol, but also solvents like N,N-dimethylformamide or the like.

In general, the liquid carrier comprises or consists of acetone, acetonitrile, aniline, anisole, benzene, benzonitrile, bromobenzene, butanol, tert-butanol, quinoline, chlorobenzene, chloroform, cyclohexane, diethylene glycol, diethyl ether, dimethylacetamide, dimethylformamide, dimethyl sulfoxide, dioxane, glacial acetic acid, acetic anhydride, ethyl acetate, ethanol, ethylene carbonate, ethylene dichloride, ethylene glycol, ethylene glycol dimethyl ether, formamide, hexane, isopropanol, methanol, methoxypropanol, 3-methyl-1-butanol, methylene chloride, methyl ethyl ketone, N-methylformamide, N-methylpyrrolidone, nitrobenzene, nitromethane, piperidine, propanol, propylene carbonate, pyridine, carbon disulfide, sulfolane, tetrachloroethene, carbon tetrachloride, tetrahydrofuran, toluene, 1,1,1-trichloroethane, trichloroethylene, triethylamine, triethylene glycol, triglyme, water or mixtures thereof.

Preferably, water is present in the liquid carrier in an amount of 0.01% to 100% by weight based on the total weight of the liquid carrier. More preferred, the amount is in the range of 1% to 100%, even more preferred 10% to 100%, even more preferred 50% to 100%, even more preferred 75% to 100%, by weight based on the total weight of the liquid carrier.

More preferred, the liquid carrier is water. In particular, high purity water is used with a resistivity of more than 15 MΩcm.

As component C of the composition for the chemical-mechanical polishing according to the present invention a polishing additive component is used in the range of 0.01% to 20% by weight based on the total amount of the composition.

A polishing additive component can comprise one or more additives. Suitable additives are oxidizers, pH regulators, stabilizers, complexing agents, corrosion inhibitors, bioactive agents or surface protecting agents.

The composition may comprise one or more of these additives. Within one group of additives one or different additives can be used, e.g. the composition according to the present invention may comprise one oxidizer or more oxidizers as sole additives or in combination with aforementioned additives.

Preferably, the amount of the polishing additive component C is 0.1% to 15%, more preferred 1% to 10%, even more preferred 2% to 8%, by weight based on the total amount of the composition.

Suitable oxidizers are peroxides, iodine, ferric nitrate, and hypochlorites.

Hypochlorites are salts of the hypochloric acid. Suitable cations are $Li^+$, $Na^+$, $K^+$, ammonium and tetraalkylammonium.

Peroxides are compounds, where oxygen ($O^{2-}$) is formally replaced by the peroxide group ($O_2^{2-}$) or in its highest oxidation stage. Peroxides are preferred. Suitable peroxides are inorganic and organic peroxides. Examples are ozone, hydrogen peroxide and its adducts such as urea hydrogen peroxide and percarbonates, organic peroxides such as benzoyl peroxide, peracetic acid, and di-tert-butyl peroxide, monopersulfates($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The peroxide preferably is selected from the group consisting of hydrogen peroxide, persulfate salts (e.g. ammonium persulfate), periodate salts, and permanganate salts. More preferably, the peroxide is hydrogen peroxide. Examples for organic peroxides are performic acid, peracetic acid, perbenzoic acid.

The amount of oxidizers is preferably in the range of 0.5% to 7%, more preferred 1% to 5%, by weight based on the total amount of the composition.

Surface protective agents are preferably suitable polymers, which are capable to protect the surface to be polished. Suitable polymers are homo- and copolymers of (meth)acrylic acid.

Suitable pH regulators are acids and bases or known pH buffers like phosphate buffers. These are described, e.g., in WO-A 2005/100496.

Accordingly, the pH regulator can be any suitable pH-adjusting or buffering compound. For example, the pH adjustor can be potassium hydroxide, sodium hydroxide, ammonia, or a combination thereof. Organic bases are alcoholates and imidazoles. Suitable acids are organic and inorganic acids like $HNO_3$, maleic acid, formic acid or acetic acid. The pH buffering agent can be any suitable buffering agent, for example, phosphates, acetates, borates, ammonium salts, and the like. The chemical-mechanical polishing system can comprise any suitable amount of a pH adjustor and/or a pH buffering agent, provided such amount is sufficient to achieve and/or maintain the pH of the polishing system. Suitable pH ranges are from 2 to 13, preferably 4 to 7 but especially for copper 8 to 11.

Suitable stabilizers are suitable to stabilize the composition according to present invention.

Especially, stabilizers are suitable to prevent aggregation of the solid particles comprised in the composition. Surfactants and anti-foaming agents can be considered as stabilizers and used as described, e.g., in WO-A 2005/100496. Accordingly, cationic surfactants, anionic surfactants, non-ionic surfactants, amphoteric surfactants, mixtures thereof, and the like can be used.

Preferably, the polishing composition comprises a non-ionic surfactant. One example of a suitable nonionic surfactant is an ethylenediamine polyoxyethylene surfactant.

The amount of surfactant typically is 0.001 wt. % to 5 wt. % (preferably 0.01 wt. % to 1 wt %, and more preferably 0.05 wt. % to 0.5 wt. %) based on the total amount of the composition.

However also anionic or cationic surfactants can be used.

Cationic and anionic surfactants are described by way of example in "Encyclopedia of Polymer Science and Technology", J. Wiley & Sons (1966), Volume 5, pp. 816 to 818, and in "Emulsion Polymerisation and Emulsion Polymers", editors P. Lovell and M. El-Asser, Verlag Wiley & Sons (1997), pp. 224-226.

Examples of anionic surfactants are alkali metal salts of organic carboxylic acids having chain lengths of from 8 to 30 carbon atoms, preferably from 12 to 18 carbon atoms. These are generally termed soaps. The salts usually used are the sodium, potassium, or ammonium salts. Other anionic surfactants which may be used are alkyl sulfates and alkyl- or alkylarylsulfonates having from 8 to 30 carbon atoms, preferably from 12 to 18 carbon atoms. Particularly suitable compounds are alkali metal dodecyl sulfates, e.g. sodium dodecyl sulfate or potassium dodecyl sulfate, and alkali metal salts of $C_{12}$-$C_{16}$ paraffinsulfonic acids. Other suitable compounds are sodium dodecylbenzenesulfonate and sodium dioctyl sulfosuccinate.

Examples of suitable cationic surfactants are salts of amines or of diamines, quaternary ammonium salts, e.g. hexadecyltrimethylammonium bromide, and also salts of long-chain substituted cyclic amines, such as pyridine, morpholine, piperidine. Use is particularly made of quaternary ammonium salts of trialkylamines, e.g. hexadecyltrimethylammonium bromide. The alkyl radicals here preferably have from 1 to 20 carbon atoms.

According to the invention, nonionic surfactants may in particular be used. Nonionic surfactants are described by way of example in CD Römpp Chemie Lexikon—Version 1.0, Stuttgart/New York: Georg Thieme Verlag 1995, keyword "Nichtionische Tenside" [Nonionic surfactants].

Examples of suitable nonionic surfactants are polyethylene-oxide- or polypropyleneoxide-based substances, such as Pluronic® or Tetronic® from BASF Aktiengesellschaft.

Polyalkylene glycols suitable as nonionic surfactants generally have a molar mass $M_n$ in the range from 1 000 to 15 000 g/mol, preferably from 2 000 to 13 000 g/mol, particularly preferably from 4 000 to 11 000 g/mol. Preferred nonionic surfactants are polyethylene glycols.

The polyalkylene glycols are known per se or may be prepared by processes known per se, for example by anionic polymerization using alkali metal hydroxide catalysts, such as sodium hydroxide or potassium hydroxide, or using alkali metal alkoxide catalysts, such as sodium methoxide, sodium ethoxide, potassium ethoxide or potassium isopropoxide, and with addition of at least one starter molecule which comprises from 2 to 8 reactive hydrogen atoms, preferably from 2 to 6 reactive hydrogen atoms, or by cationic polymerization using Lewis acid catalysts, such as antimony pentachloride, boron fluoride etherate, or bleaching earth, the starting materials being one or more alkylene oxides having 2 to 4 carbon atoms in the alkylene radical.

Examples of suitable alkylene oxides are tetrahydrofuran, butylene 1,2- or 2,3-oxide, styrene oxide, and preferably ethylene oxide and/or propylene 1,2-oxide. The alkylene oxides may be used individually, alternating one after the other, or as a mixture. Examples of starter molecules which may be used are: water, organic dicarboxylic acids, such as succinic acid, adipic acid, phthalic acid, or terephthalic acid, aliphatic or aromatic, unsubstituted or N-mono-, or N,N- or N,N'-dialkyl-substituted diamines having from 1 to 4 carbon atoms in the alkyl radical, such as unsubstituted or mono- or dialkyl-substituted ethylenediamine, diethylenetriamine, triethylenetetramine, 1,3-propylenediamine, 1,3- or 1,4-butylenediamine, or 1,2-, 1,3-, 1,4-, 1,5- or 1,6-hexamethylenediamine.

Other starter molecules which may be used are: alkanolamines, e.g. ethanolamine, N-methyl- or N-ethylethanolamine, dialkanolamines, e.g. diethanolamine, and N-methyl- and N-ethyldiethanolamine, and trialkanolamines, e.g. triethanolamine, and ammonia. It is preferable to use polyhydric alcohols, in particular di- or trihydric alcohols or alcohols with functionality higher than three, for example ethanediol, 1,2-propanediol, 1,3-propanediol, diethylene glycol, dipropylene glycol, 1,4-butanediol, 1,6-hexanediol, glycerol, trimethylolpropane, pentaerythritol, sucrose, and sorbitol.

Other suitable compounds are esterified polyalkylene glycols, such as the mono-, di-, tri- or polyesters of the polyalkylene glycols mentioned which can be prepared by reacting the terminal OH groups of the polyalkylene glycols mentioned with organic acids, preferably adipic acid or terephthalic acid, in a manner known per se.

Nonionic surfactants may be prepared by alkoxylating compounds having active hydrogen atoms, for example adducts of alkylene oxide onto fatty alcohols, oxo alcohols, or alkylphenols. It is preferable to use ethylene oxide or 1,2-propylene oxide for the alkoxylation reaction.

Other possible nonionic surfactants are alkoxylated or nonalkoxylated sugar esters or sugar ethers.

Sugar ethers are alkyl glycosides obtained by reacting fatty alcohols with sugars, and sugar esters are obtained by reacting sugars with fatty acids. The sugars, fatty alcohols, and fatty acids needed to prepare the substances mentioned are known to the person skilled in the art.

Suitable sugars are described by way of example in Beyer/Walter, Lehrbuch der or ganischen Chemie, S. Hirzel Verlag Stuttgart, 19th edition, 1981, pp. 392 to 425. Possible sugars are D-sorbitol and the sorbitans obtained by dehydrating D-sorbitol.

Suitable fatty acids are saturated or singly or multiply unsaturated unbranched or branched carboxylic acids having from 6 to 26 carbon atoms, preferably from 8 to 22 carbon atoms, particularly preferably from 10 to 20 carbon atoms, for example as mentioned in CD Römpp Chemie Lexikon—Version 1.0, Stuttgart/New York: Georg Thieme Verlag 1995, keyword "Fettsauren" [Fatty acids]. Preferred fatty acids are lauric acid, palmitic acid, stearic acid, and oleic acid.

The carbon skeleton of suitable fatty alcohols is identical with that of the compounds described as suitable fatty acids.

Sugar ethers, sugar esters, and the processes for their preparation are known to the person skilled in the art. Preferred sugar ethers are prepared by known processes, by reacting the sugars mentioned with the fatty alcohols mentioned. Preferred sugar esters are prepared by known processes, by reacting the sugars mentioned with the fatty acids mentioned. Preferred sugar esters are the mono-, di-, and triesters of the sorbitans with fatty acids, in particular sorbitan monolaurate, sorbitan dilaurate, sorbitan trilaurate, sorbitan monooleate, sorbitan dioleate, sorbitan trioleate, sorbitan monopalmitate, sorbitan dipalmitate, sorbitan tripalmitate, sorbitan monostearate, sorbitan distearate, sorbitan tristearate, and sorbitan sesquioleate, a mixture of sorbitan mono- and dioleates.

Possible compounds are hence alkoxylated sugar ethers and sugar esters obtained by alkoxylating the sugar ethers and sugar esters mentioned. Preferred alkoxylating agents are ethylene oxide and propylene 1,2-oxide. The degree of alkoxylation is generally from 1 to 20, preferably 2 to 10, particularly preferably from 2 to 6. Examples of these are polysorbates obtained by ethoxylating the sorbitan esters described above, for example as described in CD Römpp Chemie Lexikon—Version 1.0, Stuttgart/New York: Georg Thieme Verlag 1995, keyword "Polysorbate" [Polysorbates]. Suitable polysorbates are polyethoxysorbitan laurate, stearate, palmitate, tristearate, oleate, trioleate, in particular polyethoxysorbitan stearate, which is obtainable, for example, as Tween®60 from ICI America Inc. (described by way of example in CD Römpp Chemie Lexikon—Version 1.0, Stuttgart/New York: Georg Thieme Verlag 1995, keyword "Tween®").

The anti-foaming agent can be any suitable anti-foaming agent. Suitable anti-foaming agents include, but are not limited to, silicon-based and acetylenic diol-based antifoaming agents.

The amount of anti-foaming agent present in the polishing composition typically is 0.01 wt-% to 0.5 wt-% based on the total amount of the composition.

Suitable complexing agents are also described in WO-A 2005/100496.

Accordingly, the complexing agent is any suitable chemical additive that enhances the removal rate of the substrate layer being removed. Suitable complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and polycarboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like.

Further suitable complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of complexing agent will depend on the type of substrate layer being removed.

In a preferred embodiment of the present invention complexing agents are used which are mentioned above as at least bidentate organic compounds for the build-up of the metal-organic framework material. Thus, the composition according to the present invention preferably comprises at least bidentate organic compounds. Preferred compounds are those mentioned above. Accordingly, it is preferred that the composition according to the present invention comprises an additive component comprising at least one at least bidentate organic compound, which is derived from a bi-, tri-, tetracarboxylic acid or from a monocyclic, bicyclic or polycyclic ring system which is derived from at least one heterocycle selected from the group consisting of pyrrole, alpha-pyridone and gamma-pyridone and has at least two ring nitrogens as complexing agent.

In a more preferred embodiment of the present invention at least one at least bidentate organic compound is used as complexing agent, which corresponds to the at least one at least bidentate organic compound for the build-up of the metal-organic framework material of the component A.

Thus, it is preferred that the composition according to the present invention comprises the at least one at least bidentate organic compound of component A as additive component (complexing agent).

Suitable corrosion inhibitors are described in WO-A 2006/092376.

Accordingly, suitable corrosion inhibitors or other additives may be chosen from the groups (a) to (g):
(a) one or more aliphatic, cycloaliphatic or aromatic monocarboxylic acids having in each case from 3 to 16 carbon atoms in the form of their alkali metal, ammonium or substituted ammonium salts;
(b) one or more aliphatic or aromatic di- or tricarboxylic acids having in each case from 3 to 21 carbon atoms in the form of their alkali metal, ammonium or substituted ammonium salts;
(c) one or more alkali metal borates, alkali metal phosphates, alkali metal silicates, alkali metal nitrites, alkali metal or alkaline earth metal nitrates, alkali metal molybdates or alkali metal or alkaline earth metal fluorides;
(d) one or more aliphatic, cycloaliphatic or aromatic amines which have from 2 to 15 carbon atoms and may additionally comprise ether oxygen atoms or hydroxyl groups;
(e) one or more mono- or bicyclic, unsaturated or partly unsaturated heterocycles which have from 4 to 10 carbon atoms and may be benzofused and/or bear additional functional groups;
(f) one or more tetra($C_1$-$C_8$-alkoxy)silanes (tetra-$C_1$-$C_8$-alkyl orthosilicates);
(g) one or more carboxamides or sulfonamides.

Useful linear or branched-chain, aliphatic or cycloaliphatic monocarboxylic acids (a) are, for example, propionic acid, pentanoic acid, hexanoic acid, cyclohexyl acetic acid, octanoic acid, 2-ethylhexanoic acid, nonanoic acid, isononanoic acid, decanoic acid, undecanoic acid or dodecanoic acid. A suitable aromatic monocarboxylic acid (a) is in particular benzoic acid; additionally useful are also, for example, $C_1$ to $C_8$-alkylbenzoic acids such as o-, m-, p-methylbenzoic acid or p-tert-butylbenzoic acid, and hydroxyl-containing aromatic monocarboxylic acids such as o-, m- or p-hydroxybenzoic acid, o-, m- or p-(hydroxymethyl)benzoic acid or halobenzoic acids such as o-, m- or p-fluorobenzoic acid.

Typical examples of di- or tricarboxylic acids (b) are malonic acid, succinic acid, glutaric acid, adipic acid, pimelic acid, suberic acid, azelaic acid, sebacic acid, undecanedioic acid, dodecanedioic acid, dicyclopentadienedicarboxylic acid, phthalic acid, terephthalic acid and triazinetriiminocarboxylic acids such as 6,6',6''-(1,3,5-triazine-2,4,6-triyltriimino)trihexanoic acid.

All of these carboxylic acids of groups (a) and (b) are present in the form of alkali metal salts, in particular in the form of sodium or potassium salts, or in the form of ammonium salts or substituted ammonium salts (amine salts), for example with ammonia, trialkylamines or trialkanolamines.

Typical examples of corrosion inhibitors mentioned under (c) are sodium tetraborate (borax), disodium hydrogenphosphate, trisodium phosphate, sodium metasilicate, sodium nitrite, sodium nitrate, magnesium nitrate, sodium fluoride, potassium fluoride, magnesium fluoride and sodium molybdate.

When alkali metal silicates are also used, they are appropriately stabilized by customary organosilicophosphonates or organosilicosulfonates in customary amounts.

Possible aliphatic, cycloaliphatic or aromatic amines (d) having from 2 to 15, preferably from 4 to 8 carbon atoms, which may additionally comprise ether oxygen atoms, in particular from 1 to 3 ether oxygen atoms, or hydroxyl groups, in particular from 1 to 3 hydroxyl groups, are, for example, ethylamine, propylamine, isopropylamine, n-butylamine, isobutylamine, sec-butylamine, tert-butylamine, n-pentylamine, n-hexylamine, n-heptylamine, n-octylamine, isononylamine, di-n-propylamine, diisopropylamine, di-n-butylamine, mono-, di- and triethanolamine, piperidine, morpholine, aniline or benzylamine. Aliphatic and cycloaliphatic amines (d) are generally saturated.

The heterocycles (e) are, for example, monocyclic five- or six-membered systems having 1, 2 or 3 nitrogen atoms or having one nitrogen atom and one sulfur atom, which may be benzofused. It is also possible to use bicyclic systems composed of five- and/or six-membered rings having typically 2, 3 or 4 nitrogen atoms.

The heterocycles (e) may additionally bear functional groups, preferably $C_1$-$C_4$-alkoxy, amino and/or mercapto. The basic heterocyclic skeleton may of course also bear alkyl groups, in particular $C_1$-$C_4$-alkyl groups.

Typical examples of heterocycles (e) are benzotriazole, tolutriazole (tolyltriazole), hydrogenated tolutriazole, 1H-1,2,4-triazole, benzimidazole, benzothiazole, adenine, purine, 6-methoxypurine, indole, isoindole, isoindoline, pyridine, pyrimidine, 3,4-diaminopyridine, 2-aminopyrimidine and 2-mercaptopyrimidine.

For the tetra($C_1$-$C_8$-alkoxy)silanes (f), useful examples are tetramethoxysilane, tetraethoxysilane, tetra-n-propoxysilane or tetra-n-butoxysilane.

The amides (g) may optionally be alkyl-substituted on the nitrogen atom of the amide group, for example by a $C_1$-$C_4$-alkyl group. Basic aromatic or heteroaromatic skeletons of the molecule may of course also bear such alkyl groups. In the molecule, one or more, preferably one or two, amide groups may be present. The amides may bear additional functional groups, preferably $C_1$-$C_4$-alkoxy, amino, chlorine, fluorine, hydroxyl and/or acetyl; in particular, such functional groups are present as substituents on aromatic or heteroaromatic rings present.

Typical examples of such carboxamides and sulfonamides of group (g) are listed in DE-A 100 36 031.

In particular, typical examples of such carboxamides and sulfonamides of group (g) are listed below.
aromatic carboxamides:
benzamide, 2-methylbenzamide, 3-methylbenzamide, 4-methylbenzamide, 2,4-dimethylbenzamide, 4-tert-butylbenzamide, 3-methoxybenzamide, 4-methoxybenzamide, 2-aminobenzamide (anthranilamide), 3-aminobenzamide, 4-aminobenzamide, 3-amino-4-methylbenzamide, 2-chlorobenzamide, 3-chlorobenzamide, 4-chlorobenzamide, 2-fluorobenzamide, 3-fluorobenzamide, 4-fluorobenzamide, 2,6-difluorobenzamide, 4-hydroxybenzamide, phthalamide, terephthalamide;
heteroaromatic carboxamides:
nicotinamide (pyridine-3-carboxamide), picolinamide (pyridine-2-carboxamide);
aliphatic carboxamides:
succinamide, adipamide, propionamide, hexanamide;

cycloaliphatic carboxamides having the amide moiety as a constituent of the ring:
2-pyrrolidone, N-methyl-2-pyrrolidone, 2-piperidone, ε-caprolactam;
aliphatic sulfonamides:
methanesulfonamide, hexane-1-sulfonamide;
aromatic sulfonamides:
benzenesulfonamide, o-toluenesulfonamide, m-toluenesulfonamide, p-toluenesulfonamide, 4-tert-butylbenzenesulfonamide, 4-fluorobenzenesulfonamide, 4-hydroxybenzenesulfonamide, 2-aminobenzenesulfonamide, 3-aminobenzenesulfonamide, 4-aminobenzenesulfonamide, 4-acetylbenzenesulfonamide.

These different carboxylic acids may, for example, be mixtures of an aliphatic monocarboxylic acid and an aliphatic dicarboxylic acid, of an aromatic monocarboxylic acid and an aliphatic dicarboxylic acid, of an aliphatic monocarboxylic acid and an aromatic monocarboxylic acid, of two aliphatic monocarboxylic acids or of two aliphatic dicarboxylic acids. Suitable heterocycles to be used additionally with preference here are in particular benzotriazole and tolutriazole.

Suitable bioactive agents are, e.g., bactericides and fungicides. The biocide can be any suitable biocide, for example isothiazolinone (Proxel Ultra 10, from Arch). The amount of biocide used in the polishing system typically is about 1 to about 50 ppm, preferably about 10 to about 20 ppm.

The composition according to the present invention can be used especially for a chemical-mechanical polishing (CMP) or electrochemical-mechanical polishing (ECMP). However the composition is also suitable for conventional mechanical polishing, glass polishing, color filter polishing, coating polishing.

Electrochemical-mechanical polishing can be used when the surface to be polished can serve as an electron conductor.

However, the chemical-mechanical polishing composition according to the present invention cannot only be used for polishing a metal surface. Also glass, Si, Si oxide, Si and Ti nitride or organic polymer surfaces may be polished.

However, it is preferred that the surface to be polished is a metal surface.

Preferably, the metal of a metal surface is Cu, Mo, W, Ta, Ti, Al, Ru, Pt, Ag, Au, or a mixture thereof including alloys. More preferred metals are Cu, Ta, Ti, Al or W, especially Cu.

Preferably, the metal surface is the surface of an integrated circuit chip.

Another aspect of the present invention is a method for chemical-mechanical polishing of a surface comprising the steps of
(a) contacting the surface with a composition according to one of the claims 1 to 10 having a first pH value,
(b) polishing the surface.

The surface to be polished is preferably a metal surface. Preferably, the metal of the metal surface is Cu, Mo, W, Ta, Ru, Pt, Ag, Au, Ti, Al or a mixture thereof including alloys. More preferred metals are Cu, Ta, Ti, Al or W, especially Cu.

The metal surface may be a surface of an integrated circuit chip.

For electrochemical-mechanical polishing it is necessary that the surface is conducting.

In a preferred embodiment of the present invention, the method may comprise a further step of
(c) changing the pH value to a second pH value.

This is advantageous in case the metal-organic framework materials are stable in a pH range including the first pH value and instable in a range including the second pH value, so that the particles can at least partially be resolved. This facilitates the disposal of the composition. Another or an additional possibility for the removal is the use of a complexing agent.

For metal-organic framework materials based on polycarboxylic acids which are derived from di-, tri- or tetracarboxylic acids the first pH is in the range of 2 to 8 and the second is in the range of 6 to 13, provided that the second pH is higher than the first.

For metal-organic framework materials based on polycarboxylic acids which are derived from pyrrole or pyrdone the first pH is in the range of 6 to 13 and the second is in the range of 2 to 8, provided that the second pH is lower than the first.

EXAMPLES

Example 1

Inventive

Preparation of Composition

An Al-terephthalate metal-organic framework material is prepared in accordance to example 26 of WO-A 200//023134.

Subsequently the powder is suspended in water (10 wt %) and milled down to an average particle size of 1 μm by means of a stirring mill.

With the material obtained according to the above procedure a polishing slurry is prepared. The mixture is diluted with ultra-pure water to obtain a solid content (S.C.) of 8%. Then BTA is added in a concentration of 0.01 wt-%, pH is adjusted to 7.5 by ammonia. Finally $H_2O_2$ (0.2 wt %) is added to obtain the final slurry with a S.C. of 1.5%.

Example 2

Comparative

Preparation of Composition

A slurry with the above composition is prepared except that colloidal silica is used to obtain a final S.C. of 10%.

Example 3

Polishing Experiments

Polishing experiments are performed with the compositions of examples 1 and 2 on an IPEC 776, 8" polisher with the following machine parameters: Down Force=4 psi, Slurry flow Rate=160 mL/min, Table Speed=125 rpm, Carrier Speed=116 rpm, Pad Type =IC 1000.

On blanket Cu wafers the MRR and the Non-unifomity are measured resulting in better values for the inventive composition according to example 1.

The invention claimed is:
1. A composition, comprising
A from 0.01% to 40% by weight, based on a total amount of the composition, of abrasive particles of a porous metal-organic framework material, wherein the framework material comprises an at least bi-dentate organic compound coordinately bound to a metal ion;
B from 40% to 99.8% by weight, based on the total amount of the composition, of a liquid carrier; and
C from 0.01% to 20% by weight, based on the total amount of the composition, of a polishing additive component.
2. The composition according to claim 1, wherein the polishing additive component comprises at least one additive selected from the group consisting of an oxidizer, a pH regu- lator, a stabilizer, a complexing agent, a corrosion inhibitor, a bioactive agent and a surface protecting agent.

3. The composition according to claim 1, wherein the composition comprises the components A, B, and C, based of the total weight of the composition, of
A from 0.1% to 30% by weight,
B from 75% to 99% by weight, and
C from 0.1% to 15% by weight.

4. The composition according to claim 1, wherein the abrasive particles have a diameter $d_{50}$ of less than 2 μm.

5. The composition according to claim 1, wherein the metal ion is at least one metal ion selected from the group consisting of Mg, Ca, Al, In, Cu, Ta, Zn, Y, Sc, a lanthanide, Zr, Ti, Mn, Fe, Ni, and Co.

6. The composition according to claim 1,
wherein the at least bidentate organic compound is obtained by a bi-, tri-, or tetracarboxylic acid or by a monocyclic, bicyclic, or polycyclic ring system obtained by at least one heterocycle selected from the group consisting of pyrrole, alpha-pyridone, and gamma-pyridone, and
the at least bidentate organic compound has at least two ring nitrogens.

7. The composition according to claim 1, wherein the polishing additive component comprises an oxidizer selected from the group consisting of a peroxide, iodine, ferric nitrate, and a hypochlorite.

8. The composition according to claim 1, wherein the liquid carrier comprises water.

9. The composition according to claim 8, wherein water is present in an amount of from 0.01% to 100% by weight based on the total weight of the liquid carrier.

10. A method comprising chemical-mechanically polishing or electrochemical-mechanically polishing a surface with the composition according to claim 1, wherein the polishing comprises:
(a) contacting the surface with the composition according to claim 1 having a first pH value and,
(b) polishing the surface.

11. The method according to claim 10, wherein the polishing further comprises:
(c) changing the first pH value to a second pH value.

12. The method according to claim 10, wherein the surface is a metal surface, a glass, Si, Si oxide, Si nitride, Ti nitride, or an organic polymer surface.

13. The method according to claim 12, wherein the metal of the metal surface comprises Cu, Mo, W, Ta, Ru, Pt, Ag, Au, Al, Ti or a mixture or alloy thereof.

14. The method according to claim 12, wherein the metal surface is a surface of an integrated circuit chip.

15. The method according to claim 12, wherein the surface is conducting.

* * * * *